(12) United States Patent
Fukuzumi et al.

(10) Patent No.: US 11,257,842 B2
(45) Date of Patent: Feb. 22, 2022

(54) NONVOLATILE SEMICONDUCTOR MEMORY DEVICE AND METHOD FOR MANUFACTURING SAME

(71) Applicant: Kioxia Corporation, Minato-ku (JP)

(72) Inventors: Yoshiaki Fukuzumi, Yokohama (JP); Ryota Katsumata, Yokohama (JP); Masaru Kito, Yokohama (JP); Masaru Kidoh, Tokyo (JP); Hiroyasu Tanaka, Tokyo (JP); Yosuke Komori, Yokohama (JP); Megumi Ishiduki, Yokohama (JP); Junya Matsunami, Yokohama (JP); Tomoko Fujiwara, Yokohama (JP); Hideaki Aochi, Kawasaki (JP); Ryouhei Kirisawa, Yokohama (JP); Yoshimasa Mikajiri, Yokohama (JP); Shigeto Oota, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 125 days.

(21) Appl. No.: 16/849,457

(22) Filed: Apr. 15, 2020

(65) Prior Publication Data

US 2020/0243560 A1    Jul. 30, 2020

Related U.S. Application Data

(63) Continuation of application No. 16/519,705, filed on Jul. 23, 2019, now Pat. No. 10,658,383, which is a
(Continued)

(30) Foreign Application Priority Data

Mar. 24, 2009   (JP) ................................ 2009-072950

(51) Int. Cl.
*H01L 29/76* (2006.01)
*H01L 27/11582* (2017.01)
(Continued)

(52) U.S. Cl.
CPC ...... *H01L 27/11582* (2013.01); *H01L 21/223* (2013.01); *H01L 21/265* (2013.01);
(Continued)

(58) Field of Classification Search
CPC ..................... H01L 27/11556; H01L 27/11582
See application file for complete search history.

(56) References Cited

U.S. PATENT DOCUMENTS 8,653,582 B2   2/2014  Fukuzumi et al.
9,312,134 B2   4/2016  Fukuzumi
(Continued)

FOREIGN PATENT DOCUMENTS

JP   2007-266143   10/2007
JP   2007-317874   12/2007
(Continued)

OTHER PUBLICATIONS

U.S. Appl. No. 14/150,504, Fukuzumi et al., filed Jan. 8, 2014.
(Continued)

*Primary Examiner* — Samuel A Gebremariam
(74) *Attorney, Agent, or Firm* — Oblon, McClelland, Maier & Neustadt, L.L.P.

(57) ABSTRACT

A nonvolatile semiconductor memory device, includes: a stacked structural unit including a plurality of insulating films alternately stacked with a plurality of electrode films in a first direction; a selection gate electrode stacked on the stacked structural unit in the first direction; an insulating layer stacked on the selection gate electrode in the first direction; a first semiconductor pillar piercing the stacked structural unit, the selection gate electrode, and the insulating layer in the first direction, a first cross section of the first semiconductor pillar having an annular configuration, the first cross section being cut in a plane orthogonal to the first direction; a first core unit buried in an inner side of the first
(Continued)

semiconductor pillar, the first core unit being recessed from an upper face of the insulating layer; and a first conducting layer of the first semiconductor pillar provided on the first core unit to contact the first core unit.

15 Claims, 14 Drawing Sheets

Related U.S. Application Data continuation of application No. 15/915,653, filed on Mar. 8, 2018, now Pat. No. 10,418,378, which is a continuation of application No. 15/424,532, filed on Feb. 3, 2017, now Pat. No. 9,941,296, which is a continuation of application No. 15/064,270, filed on Mar. 8, 2016, now Pat. No. 9,601,503, which is a continuation of application No. 14/833,827, filed on Aug. 24, 2015, now Pat. No. 9,318,503, which is a continuation of application No. 14/150,504, filed on Jan. 8, 2014, now Pat. No. 9,312,134, which is a continuation of application No. 12/724,713, filed on Mar. 16, 2010, now Pat. No. 8,653,582.

(51) Int. Cl.

| | | |
|---|---|---|
| *H01L 29/66* | (2006.01) | |
| *H01L 29/792* | (2006.01) | |
| *H01L 27/11578* | (2017.01) | |
| *H01L 21/223* | (2006.01) | |
| *H01L 21/265* | (2006.01) | |
| *H01L 29/78* | (2006.01) | |
| *H01L 29/04* | (2006.01) | |
| *H01L 29/16* | (2006.01) | |
| *H01L 29/423* | (2006.01) | |
| *H01L 29/49* | (2006.01) | |
| *H01L 29/10* | (2006.01) | |

(52) U.S. Cl.
CPC ........ *H01L 27/11578* (2013.01); *H01L 29/04* (2013.01); *H01L 29/1037* (2013.01); *H01L 29/16* (2013.01); *H01L 29/42344* (2013.01); *H01L 29/4916* (2013.01); *H01L 29/66666* (2013.01); *H01L 29/66833* (2013.01); *H01L 29/7827* (2013.01); *H01L 29/792* (2013.01); *H01L 29/7926* (2013.01)

(56) References Cited

U.S. PATENT DOCUMENTS

| | | |
|---|---|---|
| 9,941,296 B2 | 4/2018 | Fukuzumi |
| 2007/0252201 A1 | 11/2007 | Kito et al. |
| 2009/0146206 A1 | 6/2009 | Gukuzumi et al. |
| 2009/0294844 A1 | 12/2009 | Tanaka et al. |

FOREIGN PATENT DOCUMENTS

| | | |
|---|---|---|
| JP | 2008-72051 | 3/2008 |
| JP | 2008-186868 | 8/2008 |
| JP | 2009-135324 A | 6/2009 |
| JP | 2009-146954 A | 7/2009 |
| WO | WO 2009/075370 A1 | 6/2009 |

OTHER PUBLICATIONS

Office Action dated Sep. 12, 2011 in Japanese Patent Application No. 2009-072951 (with English language translation).
U.S. Appl. No. 15/915,653.

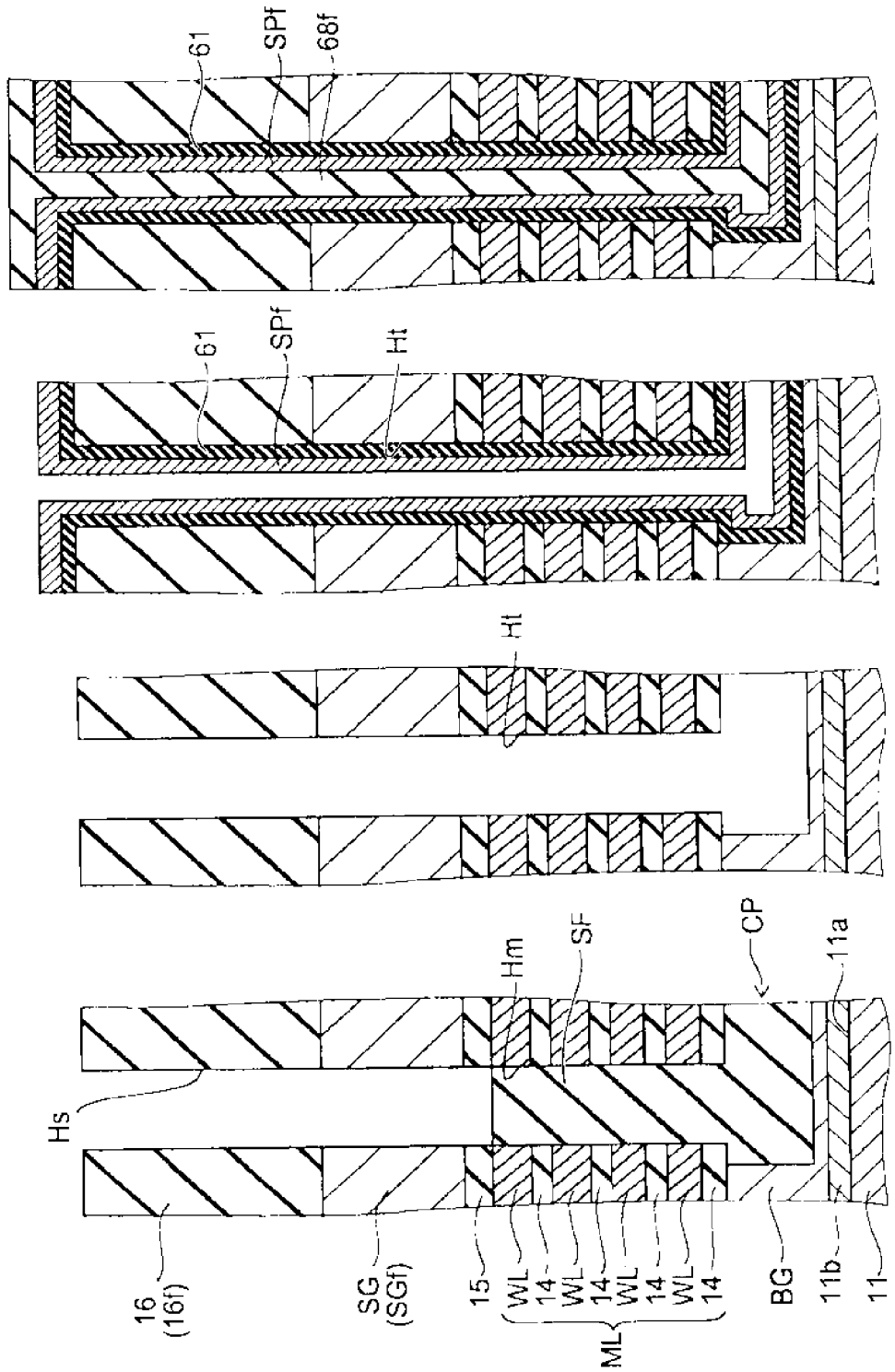

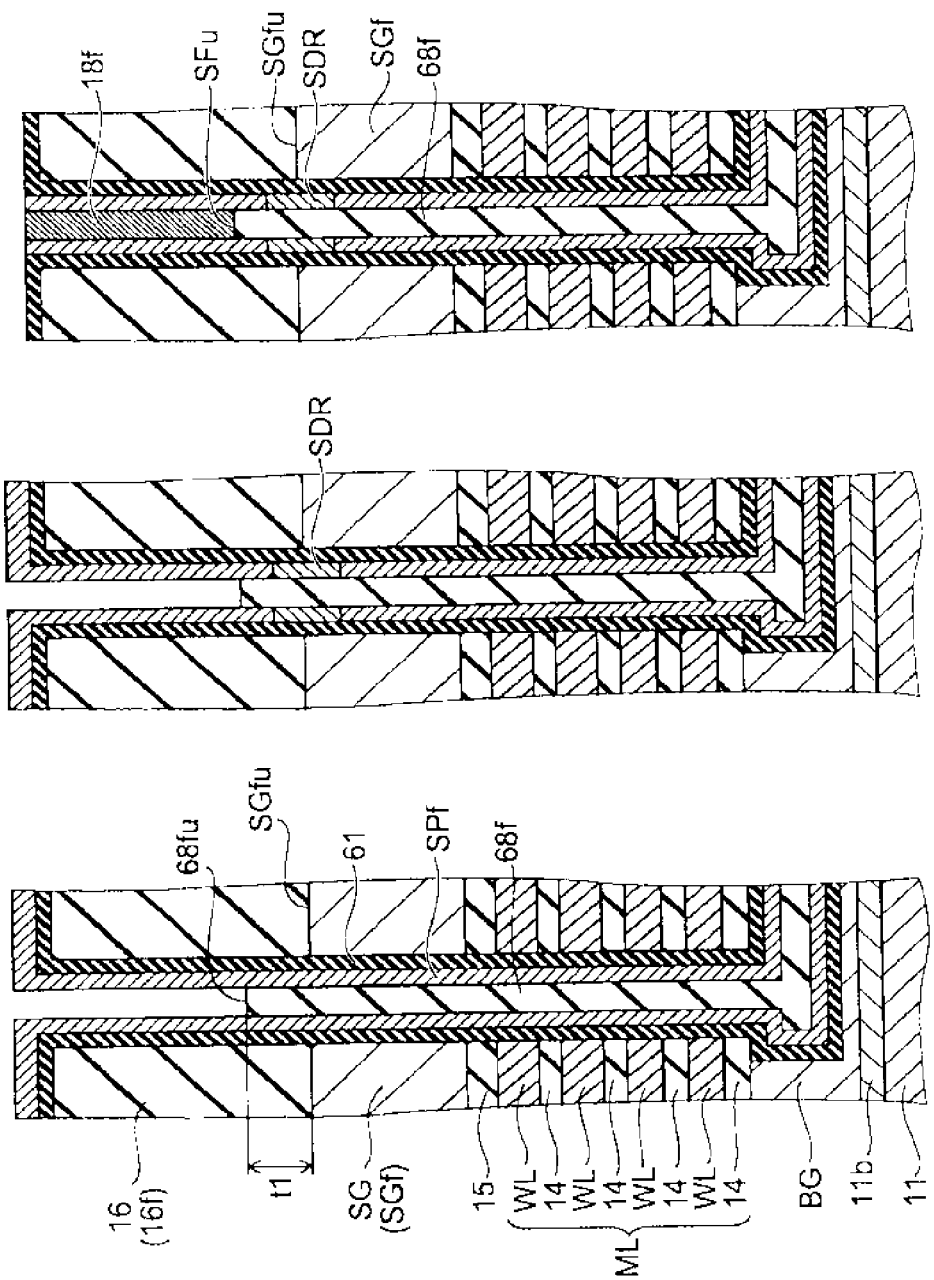

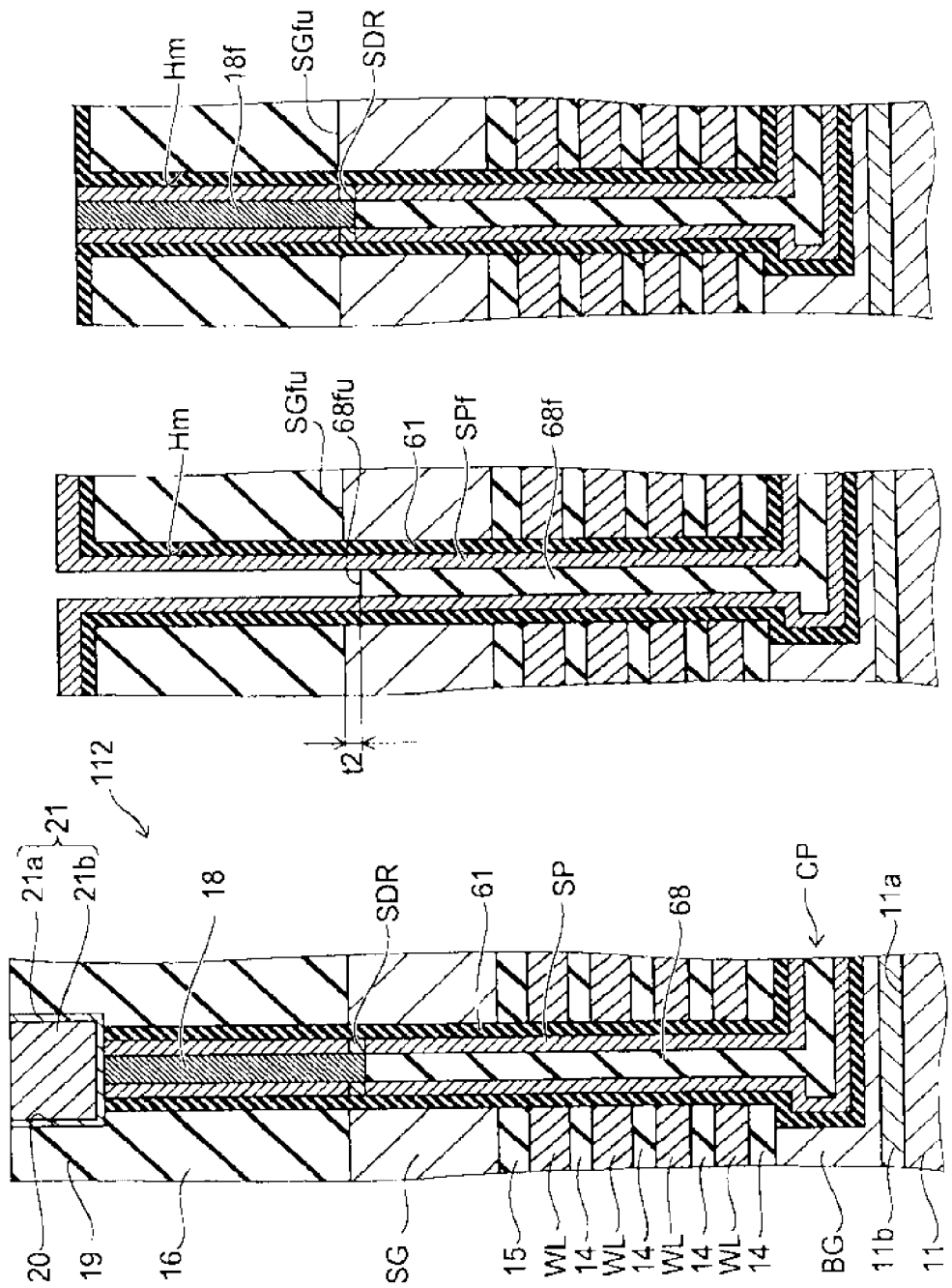

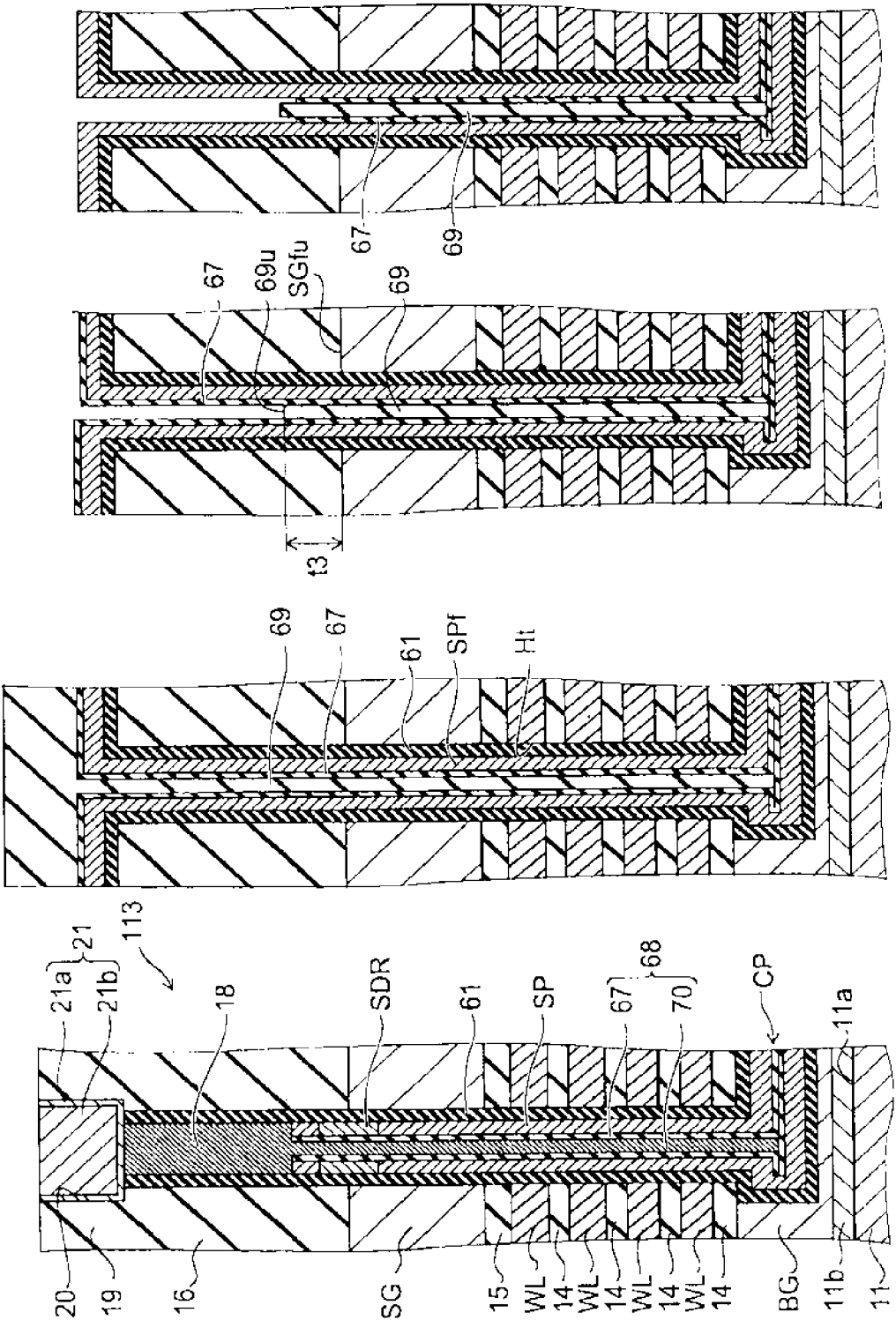

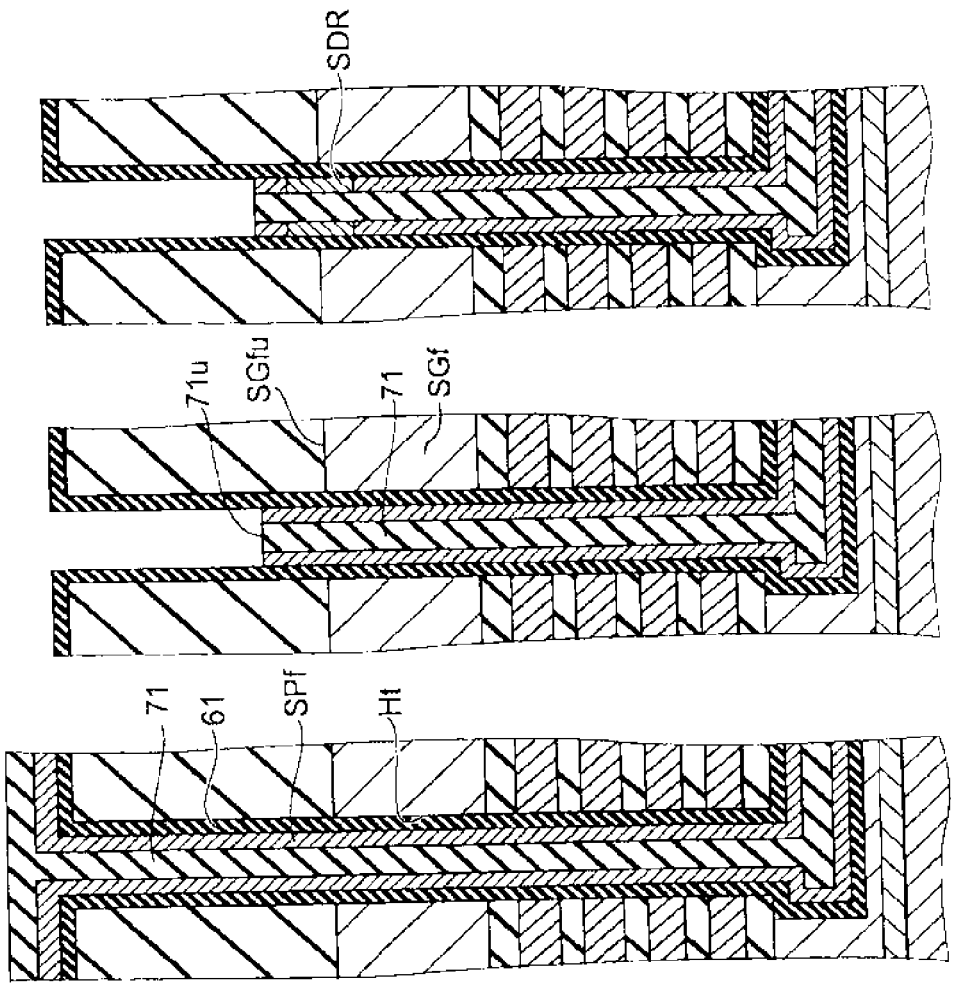

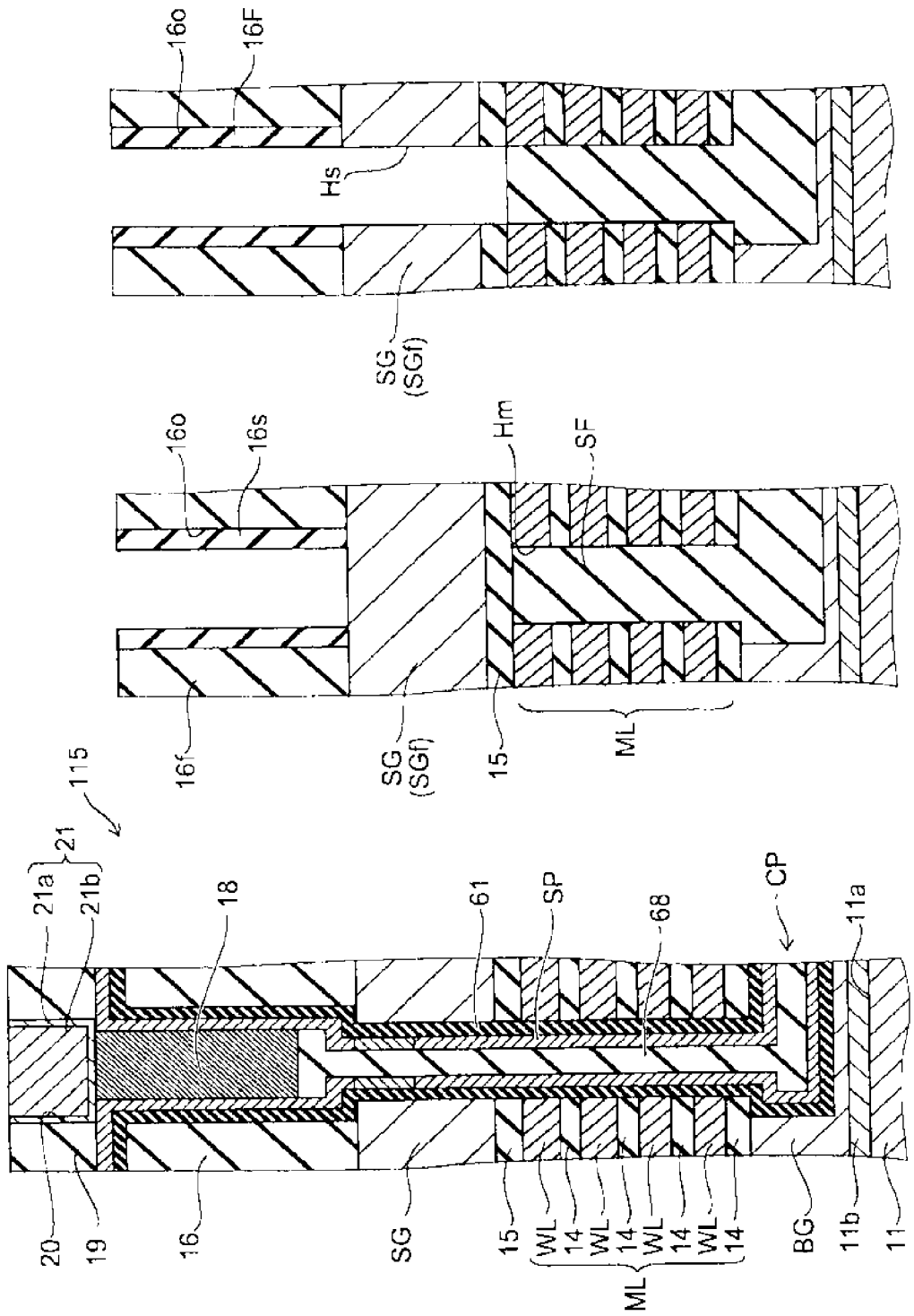

NONVOLATILE SEMICONDUCTOR MEMORY DEVICE AND METHOD FOR MANUFACTURING SAME

CROSS-REFERENCE TO RELATED APPLICATIONS

This application is a continuation of U.S. Ser. No. 16/519,705, filed Jul. 23, 2019, which is a continuation of U.S. Ser. No. 15/915,653, filed Mar. 8, 2018 (now U.S. Pat. No. 10,418,378), which is a continuation of U.S. Ser. No. 15/424,532, filed Feb. 3, 2017 (now U.S. Pat. No. 9,941,296), which is a continuation of U.S. Ser. No. 15/064,270, filed Mar. 8, 2016 (now U.S. Pat. No. 9,601,503), which is a continuation of and claims the benefit of priority under 35 U.S.C. § 120 from U.S. Ser. No. 14/833,827, filed Aug. 24, 2015 (now U.S. Pat. No. 9,318,503) which is a continuation of U.S. Ser. No. 14/150,504, filed Jan. 8, 2014 (now U.S. Pat. No. 9,312,134), which is a continuation of U.S. Ser. No. 12/724,713, filed Mar. 16, 2010, now U.S. Pat. No. 8,653,582, and is based upon and claims the benefit of priority from prior Japanese Patent Application No. 2009-072950, filed on Mar. 24, 2009, the entire contents of each of which are incorporated herein by reference.

BACKGROUND

Field

Embodiments of the invention relate generally to a nonvolatile semiconductor memory device and a method for manufacturing the same.

Background Art

Structures, for example, in which one-time programmable elements are disposed between multiple layer interconnects, and structures in which conventional NAND flash memory is formed in multiple layers by repeated epitaxial formation of silicon films, etc., have been proposed as technology to realize higher memory density without depending on the downscaling of lithography. However, in such methods, the number of lithography steps undesirably increases as the number of stacks increases.

To replace such technology, stacked vertical memory has been proposed (for example, refer to JP-A 2007-266143 (Kokai). In such technology, a memory string made of stacked memory elements is made with one forming by stacking any number of layers of stacked electrodes, collectively making through-holes, forming a memory film including a charge storage layer and the like on the inner walls of the through-holes, and subsequently filling a polysilicon film into the interior. Thereby, a memory can be realized in which the number of lithography steps substantially does not increase even when the number of stacks increases.

Technology also exists to make the semiconductor pillar forming the memory string in a hollow cylindrical configuration to improve the characteristics of the polysilicon channel transistor of such a stacked vertical memory. Thereby, the semiconductor pillar can be formed in a thin film, the effect of states in the polysilicon film can be reduced, and the fluctuation of characteristics of memory cells can be reduced.

However, it is necessary to set the impurity concentration of the source-drain diffusion layer and the channel portion to be relatively high in the case where the semiconductor pillar has a hollow cylindrical configuration with a thin film and a reduced volume. To this end, performing ion implantation from the surface of the stacked structural unit at high acceleration and high currents leads to problems such as longer processing time, increased manufacturing costs, and poor position controllability at deep positions of the stacked structural unit.

Thus, a structure of a high-concentration source-drain diffusion layer having high position controllability while using a hollow cylindrical semiconductor pillar is desired.

SUMMARY

According to an aspect of the invention, there is provided a nonvolatile semiconductor memory device, including: a stacked structural unit including a plurality of insulating films alternately stacked with a plurality of electrode films in a first direction; a selection gate electrode stacked on the stacked structural unit in the first direction; an insulating layer stacked on the selection gate electrode in the first direction; a first semiconductor pillar piercing the stacked structural unit, the selection gate electrode, and the insulating layer in the first direction, a first cross section of the first semiconductor pillar having an annular configuration, the first cross section being cut in a plane orthogonal to the first direction; a first core unit buried in an inner side of the first semiconductor pillar, the first core unit being recessed from an upper face of the insulating layer; and a first conducting layer of the first semiconductor pillar provided on the first core unit to contact the first core unit.

According to another aspect of the invention, there is provided a method for manufacturing a nonvolatile semiconductor memory device, including: forming a stacked structural unit including an insulating film alternately stacked with an electrode film on a major surface of a substrate; forming a selection gate electrode on the stacked structural unit; forming an insulating layer on the selection gate electrode; making a first through-hole piercing at least the selection gate electrode and the insulating layer in a first direction perpendicular to the major surface and forming a semiconductor film on an inner side face of the first through-hole; forming a core unit on an inner side of the semiconductor film; recessing the core unit; and introducing an impurity into the semiconductor film.

According to another aspect of the invention, there is provided a method for manufacturing a nonvolatile semiconductor memory device, including: forming a stacked structural unit including an insulating film alternately stacked with an electrode film on a major surface of a substrate; forming a selection gate electrode on the stacked structural unit; forming an insulating layer on the selection gate electrode; making a second through-hole and a third through-hole, the second through-hole piercing the selection gate electrode in a first direction perpendicular to the major surface, the third through-hole piercing the insulating layer in the first direction to communicate with the second through-hole, a diameter of the third through-hole at an upper end of the insulating layer being larger than a diameter of the second through-hole; forming a semiconductor film on inner side faces of the second through-hole and the third through-hole; and implanting an impurity into a portion of the semiconductor film on the selection gate electrode side.

BRIEF DESCRIPTION OF THE DRAWINGS

FIGS. 3A to 3D are schematic cross-sectional views in order of the processes, illustrating the method for manufacturing the nonvolatile semiconductor memory device according to the first example of the invention;

FIGS. 4A to 4C are schematic cross-sectional views in order of the processes, continuing from FIG. 3D;

FIGS. 5A to 5C are schematic cross-sectional views illustrating the configuration of a nonvolatile semiconductor memory device and a method for manufacturing the same according to a second example of the invention;

FIGS. 6A to 6D are schematic cross-sectional views illustrating the configuration of a nonvolatile semiconductor memory device and a method for manufacturing the same according to a third example of the invention;

FIGS. 8A to 8D are schematic cross-sectional views illustrating the configuration of a nonvolatile semiconductor memory device and a method for manufacturing the same according to a fourth example of the invention;

FIGS. 9A to 9C are schematic cross-sectional views illustrating the configuration of a nonvolatile semiconductor memory device and a method for manufacturing the same according to a fifth example of the invention;

DETAILED DESCRIPTION

Figure 1:
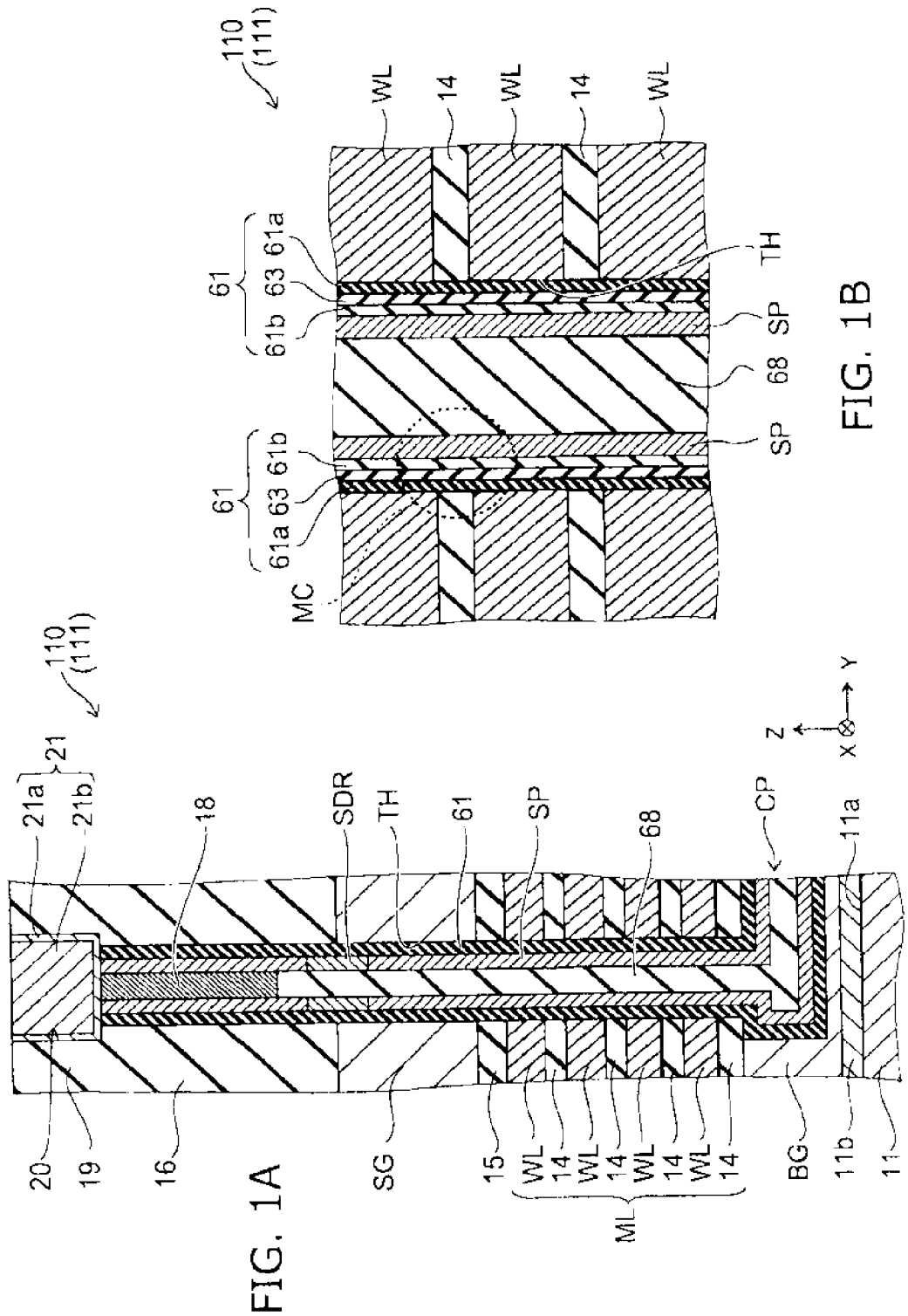
FIGS. 1A and 1B are schematic cross-sectional views illustrating the configuration of a nonvolatile semiconductor memory device according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

FIGS. 1A and 1B are schematic cross-sectional views illustrating the configuration of a nonvolatile semiconductor memory device according to a first embodiment of the invention.

Figure 2:
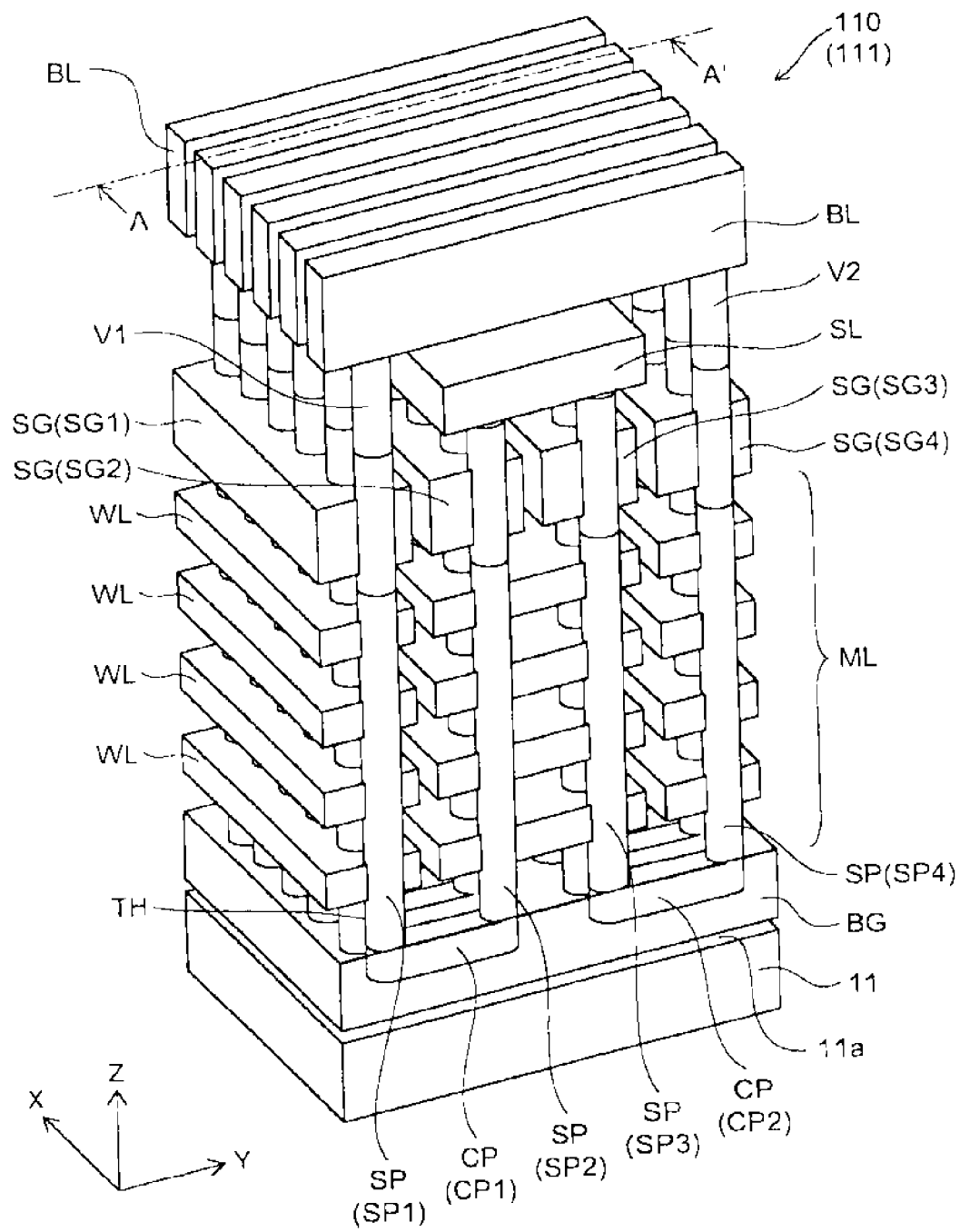
FIG. 2 is a schematic perspective view illustrating the configuration of the nonvolatile semiconductor memory device according to the first embodiment of the invention.

FIG. 2 is a schematic perspective view illustrating the configuration of the nonvolatile semiconductor memory device according to the first embodiment of the invention.

For easier viewing of the drawing, FIG. 2 illustrates only electrically conducting portions, and insulating portions are omitted.

First, one example of the overview of the configuration of the nonvolatile semiconductor memory device according to this embodiment is described using FIG. 2.

A nonvolatile semiconductor memory device 110 according to this embodiment is a three dimensional stacked flash memory. As described below, cell transistors are arranged in a three dimensional matrix configuration in the nonvolatile semiconductor memory device 110. A charge storage layer is provided in each of the cell transistors. Each of the cell transistors functions as a memory cell to store data by storing a charge in the charge storage layer.

As illustrated in FIG. 2, a substrate 11 made of, for example, a semiconductor such as monocrystalline silicon and the like is provided in the nonvolatile semiconductor memory device 110. A memory array region where memory cells are formed and a circuit region that drives the memory cells are set in the substrate 11. FIG. 2 illustrates the configuration of the memory array region, and the circuit region is omitted.

In the memory array region, a stacked structural unit ML is formed on a major surface 11a of the substrate 11. Electrode films WL are alternately stacked with insulating films 14 in the stacked structural unit ML.

An XYZ orthogonal coordinate system will now be introduced for convenience of description in the specification of the application. In this coordinate system, a direction perpendicular to the major surface 11a of the substrate 11 is taken as a Z-axis direction (first direction). One direction in a plane parallel to the major surface 11a is taken as an X-axis direction (second direction). A direction perpendicular to the Z axis and the X axis is taken as a Y-axis direction (third direction).

Namely, the stacking direction of the electrode films WL and the insulating films 14 in the stacked structural unit ML is the Z-axis direction.

Semiconductor pillars SP piercing the stacked structural unit ML in the Z-axis direction are provided.

Selection gate electrodes SG are provided above the stacked structural unit ML. Any conducting material may be used as the selection gate electrodes SG; and polysilicon, for example, may be used. The selection gate electrodes SG are formed by dividing a conducting film along a certain direction. In this specific example, the selection gate electrodes SG are divided along the Y-axis direction. In other words, the selection gate electrodes SG are multiple conducting members having interconnect configurations aligned in the X-axis direction.

On the other hand, the electrode films WL are conducting films parallel to the XY plane and divided, for example, into erasing block units. The electrode films WL also may be divided to align, for example, in the X-axis direction similarly to the selection gate electrodes SG.

Multiple through-holes TH are made in the stacked structural unit ML and the selection gate electrodes SG to align in the stacking direction (the Z-axis direction). The semiconductor pillars SP are formed by providing an insulating film on the side faces of the interiors of the through-holes TH and filling a semiconductor material into the space on the inner sides thereof.

The semiconductor pillar SP is multiply provided in the XY plane. In this specific example, two semiconductor pillars SP arranged adjacently in the Y-axis direction form one pair. In other words, the nonvolatile semiconductor memory device 110 further includes a first connection portion CP1 (connection portion CP) that electrically connects a first semiconductor pillar SP1 and a second semiconductor pillar SP2 on the substrate 11 side. Namely, the first and second semiconductor pillars SP1 and SP2 are connected by the first connection portion CP1 and function as one NAND string having a U-shaped configuration. Third and fourth semiconductor pillars SP3 and SP4 are provided adjacent to the second semiconductor pillar SP2 in the Y-axis direction on the side opposite to the first semiconductor pillar SP1, are connected to each other by a second connection portion CP2, and function as another NAND string having a U-shaped configuration. Thus, two semiconductor pillar SP pairs are formed.

Then, for example, the two adjacent semiconductor pillars (the semiconductor pillars SP2 and SP3) on the inner side of the two NAND strings having the U-shaped configurations are connected to a source line SL. The two semiconductor pillars (the semiconductor pillars SP1 and SP4) on the outer sides are connected to the same bit line BL by through-electrodes V1 and V2, respectively.

Thus, in a stacked vertical memory, a polysilicon contact is unnecessary at the lower portion of the memory string because the memory strings are connected in a U-shaped configuration, and the degrees of freedom of the memory film configuration increase.

In other words, in a stacked vertical memory, it is necessary to form the gate insulating film of the memory element prior to forming the polysilicon film forming the channel. At this time, it is necessary to obtain a good polysilicon-polysilicon contact at the lower portion of the semiconductor pillar SP because a current flows in the memory string. It is necessary to use, for example, a memory film configuration that can withstand dilute hydrofluoric acid processing, and there are constraints on the memory film configuration. Conversely, as described above, a memory string having a U-shaped configuration can resolve such constraints and is advantageous, for example, in the case where multi-bit technology and the like are promoted as methods to further increase the density of the stacked vertical memory recited above, etc.

However, as described below, the invention is not limited thereto. Each of the semiconductor pillars SP may be independent. In such a case, the semiconductor pillars SP are not connected by the connection portion CP, and selection gate electrodes are provided at both the upper portion and the lower portion of the stacked structural unit ML to select the semiconductor pillars SP. Hereinbelow, the case is described where two of the semiconductor pillars SP are connected by the connection portion CP.

Herein, "semiconductor pillar SP" is used to refer to all of the semiconductor pillars or any semiconductor pillar; and "semiconductor pillar SPN" (N being any integer not less than 1) is used to refer to a designated semiconductor pillar.

The electrode films corresponding to the semiconductor pillars SP1 and SP4 are commonly connected, and the electrode films corresponding to the semiconductor pillars SP2 and SP3 are commonly connected. Similarly, the electrode films corresponding to the semiconductor pillars SP(4M+1) and SP(4M+4) are commonly connected, where M is an integer not less than 0 and the N recited above is (4M+1) and (4M+4); and the electrode films corresponding to the semiconductor pillars SP(4M+2) and (4M+3) are commonly connected, where N is (4M+2) and (4M+3).

In other words, the electrode films WL have an inter digital electrode or multi-finger electrode structure in which the electrode films WL are combined with each other in a comb teeth configuration opposing in the X-axis direction.

The electrode films WL corresponding to the semiconductor pillars SP(4M+1) and SP(4M+4) and the electrode films WL corresponding to the semiconductor pillars SP(4M+2) and (4M+3) are electrically connected at both ends in the X-axis direction to, for example, the peripheral circuit provided in the substrate 11. In other words, similarly to, for example, the stairstep structure discussed in JP-A 2007-266143 (Kokai), the length in the X-axis direction of each of the electrode films WL stacked in the Z-axis direction changes in a stairstep configuration; and each of the electrode films WL is connected to the peripheral circuit at each of the ends in the X-axis direction.

Thereby, the memory cells of the same layer corresponding to the first semiconductor pillar SP1 and the second semiconductor pillar SP2 can be operated independently from each other; and the memory cells of the same layer corresponding to the third semiconductor pillar SP3 and the fourth semiconductor pillar SP4 can be operated independently from each other.

The combination of the electrode films corresponding to the semiconductor pillars SP(4M+1) and SP(4M+4) and the electrode films corresponding to the semiconductor pillars SP(4M+2) and (4M+3) can be taken to be one erasing block; and each of the electrode films can be divided for each erasing block.

The number of the semiconductor pillars included in each of the erasing blocks in the X-axis direction and the Y-axis direction is arbitrary.

FIGS. 1A and 1B illustrate the configuration of a portion of the nonvolatile semiconductor memory device 110. Namely, FIG. 1A illustrates the semiconductor pillar SP1 illustrated in FIG. 2, and FIG. 1B illustrates a further enlarged portion corresponding to the stacked structural unit ML of the semiconductor pillar SP1.

As illustrated in FIGS. 1A and 1B, an inter-layer insulating film 11b is provided on the major surface 11a of the substrate 11. The back gate BG is provided thereupon, and the stacked structural unit ML is provided thereupon. In the stacked structural unit ML, multiple insulating films 14 are alternately stacked with multiple electrode films WL in the Z-axis direction (the first direction).

The selection gate electrode SG is provided on the stacked structural unit ML in the Z-axis direction. The insulating layer 16 is provided on the selection gate electrode SG in the Z-axis direction.

The semiconductor pillar SP piercing the stacked structural unit ML, the selection gate electrode SG, and the insulating layer 16 in the Z-axis direction is provided. The cross section (the first cross section) of the semiconductor pillar SP has an annular configuration when cut in a plane orthogonal to the Z-axis. In other words, the semiconductor pillar SP has a hollow cylindrical configuration.

A core unit 68 is buried in the inner side of the semiconductor pillar SP. The upper end of the core unit 68 is recessed below the upper end of the insulating layer 16. In other words, the core unit 68 is recessed from the upper face of the insulating layer 16.

A first conducting layer 18 is provided on the core unit 68 (in the Z-axis direction) on the inner side of the semiconductor pillar SP.

The invention is not limited thereto. As described below, it is sufficient that the first conducting layer 18 is provided on the core unit 68 on the inner side of the semiconductor pillar SP, on the semiconductor pillar SP, or both.

A configuration similar to that of the first semiconductor pillar SP1 is provided also for the second semiconductor pillar SP2 described above. In other words, the nonvolatile semiconductor memory device 110 includes: the stacked structural unit ML including the multiple insulating films 14 alternately stacked with the multiple electrode films WL in the first direction; the selection gate electrode SG stacked on the stacked structural unit ML in the first direction; the insulating layer 16 stacked on the selection gate electrode SG in the first direction; and the first semiconductor pillar SP1 piercing the stacked structural unit ML, the selection gate electrode SG, and the insulating layer 16 in the first direction. A cross section (a first cross section) of the first semiconductor pillar SP1 has an annular configuration when cut in a plane orthogonal to the first direction. A first core unit is buried in an inner side of the first semiconductor pillar SP1 and is recessed from the upper face of the insulating layer 16. The first conducting layer of the first semiconductor pillar SP1 is provided on the first core unit to contact the first core unit.

The nonvolatile semiconductor memory device 110 further includes: the second semiconductor pillar SP2 adjacent to the first semiconductor pillar SP1 in the second direction (in this case, the Y-axis direction) orthogonal to the first direction (the Z-axis direction), where the second semiconductor pillar SP2 pierces the stacked structural unit ML, the selection gate electrode SG, and the insulating layer 16 in the first direction, and a cross section (a second cross section) of the second semiconductor pillar SP2 has an annular configuration when cut in a plane orthogonal to the first direction; the second core unit buried in the inner side of the second semiconductor pillar SP2, where the second core unit is recessed from the upper face of the insulating layer 16; the first conducting layer of the second semiconductor pillar SP2 provided on the second core unit to contact the second core unit; and the connection portion CP connecting the first semiconductor pillar SP1 and the second semiconductor pillar SP2 on a side opposite to the insulating layer 16.

Hereinbelow, the first semiconductor pillar SP1 and the second semiconductor pillar SP2 are referred to as the semiconductor pillar SP. The first core unit and the second core unit are referred to as the core unit 68. The first conducting layer of the first semiconductor pillar SP1 and the first conducting layer of the second semiconductor pillar SP2 are referred to as the first conducting layer 18.

Any insulating material may be used as the insulating layer 16. For example, $SiO_2$ may be used. Any semiconductor material may be used as the semiconductor pillar SP. For example, polysilicon, amorphous silicon, etc., may be used. Any insulating material may be used as the core unit 68. For example, SiN may be used. Any conducting material may be used as the first conducting layer 18. For example, polysilicon including an added impurity may be used.

As illustrated in FIG. 1B, a memory unit stacked film 61 is provided between the semiconductor pillar SP and the electrode film WL. The memory unit stacked film 61 includes a charge storage layer 63 provided between the semiconductor pillar SP and the electrode films WL, a first memory unit insulating film 61a provided between the electrode films WL and the charge storage layer 63, and a second memory unit insulating film 61b provided between the semiconductor pillar SP and the charge storage layer 63.

In other words, the through-hole TH is provided to pierce the stacked structural unit ML in the Z-axis direction; the memory unit stacked film 61 made of the stacked films of the second memory unit insulating film 61b, the charge storage layer 63, and the first memory unit insulating film 61a is provided on the inner wall of the through-hole TH; and the semiconductor pillar SP having the hollow cylindrical configuration is provided on the side face of the inner side of the memory unit stacked film 61.

However, the nonvolatile semiconductor memory device for which this embodiment is applied is not limited to that recited above. It is sufficient to use a structure in which the semiconductor pillar is provided to pierce the stacked structural unit ML in the stacking direction, where the stacked structural unit ML includes the electrode films WL alternately stacked with the insulating films 14. The structure of the memory unit stacked film 61 recited above is arbitrary. For example, at least a portion of at least one selected from the charge storage layer 63, the first memory unit insulating film 61a, and the second memory unit insulating film 61b may be provided between the electrode films WL.

Any conducting material may be used as the electrode film WL. For example, amorphous silicon or polysilicon provided with an electrical conductivity by introducing an impurity may be used. Metal, alloys, etc., also may be used. A prescribed potential is applied to the electrode film WL by a driver circuit (not illustrated) formed in the circuit region, and the electrode film WL functions as a word line of the nonvolatile semiconductor memory device 110.

On the other hand, silicon oxide, for example, may be used as the insulating film 14, the first memory unit insulating film 61a, and the second memory unit insulating film 61b.

The insulating film 14 functions as an inter-layer insulating film to insulate the electrode films WL from each other. The first memory unit insulating film 61a provided between the electrode films WL and the charge storage layer 63 functions as a block insulating film. The second memory unit insulating film 61b provided between the semiconductor pillar SP and the charge storage layer 63 functions as a tunneling insulating film.

A silicon nitride film, for example, may be used as the charge storage layer 63. The charge storage layer 63 stores or emits a charge by an electric field applied between the semiconductor pillar SP and the electrode film WL such that the charge storage layer 63 functions as a storage layer. The charge storage layer 63 may be a single-layer film or a stacked film.

A region proximal to the portion where the semiconductor pillar SP faces the electrode film WL forms one memory cell MC.

An example of the nonvolatile semiconductor memory device having such a structure will now be described.

First Example

As illustrated in FIGS. 1A and 1B, a nonvolatile semiconductor memory device 111 of a first example has the structure of the nonvolatile semiconductor memory device 110 illustrated in FIGS. 1A and 1B.

The nonvolatile semiconductor memory device 111 uses p+ polysilicon having, for example, a thickness of 200 nm (nanometers) as the selection gate electrode SG and a TEOS (Tetra Ethyl Ortho Silicate) film having, for example, a thickness of 300 nm as the insulating layer 16. A SiN film, for example, is used as the core unit 68. The upper end of the core unit 68 is disposed above the selection gate electrode SG and below the upper end of the insulating layer 16 in the Z-axis direction. A source-drain diffusion region SDR is provided in the semiconductor pillar SP at a position proximal to the upper end of the selection gate electrode SG. The lower end of the source-drain diffusion region SDR is positioned, for example, about 50 nm downward from the upper end of the selection gate electrode SG. A metal plug 21 is provided on the upper end of the semiconductor pillar SP and the upper end of the first conducting layer 18. The metal plug 21 forms, for example, the through-electrode V1 illustrated in FIG. 2 or is electrically connected to the through-electrode V1.

The nonvolatile semiconductor memory device 111 is manufactured, for example, as follows.

FIGS. 3A to 3D are schematic cross-sectional views in order of the steps, illustrating the method for manufacturing the nonvolatile semiconductor memory device according to the first example of the invention.

FIGS. 4A to 4C are schematic cross-sectional views in order of the steps, continuing from FIG. 3D.

First, as illustrated in FIG. 3A, the inter-layer insulating film 11b and the back gate BG are formed on a substrate made of silicon. The stacked structural unit ML including the insulating films 14 alternately stacked with the electrode films WL is formed thereupon. A memory transistor hole Hm is made in the stacked structural unit ML and a portion of the back gate BG to align in the Z-axis direction using lithography and RIE. A sacrificial film SF made of, for example, a SiN film is filled into the interior of the memory transistor hole Hm. The diameter of the memory transistor hole Hm is, for example, 60 nm.

The connection portion CP made of, for example, a SiN film is formed beforehand in the back gate BG. The connection portion CP and the sacrificial film SF are connected to each other.

The inter-layer insulating film 15, a selection gate electrode film SGf forming the selection gate electrode SG of the selection transistor, and an extension inter-layer insulating film 16f forming the insulating layer 16 are stacked on the stacked structural unit ML. The selection gate electrode film SGf is formed of p+ polysilicon having, for example, a thickness of 200 nm. A TEOS film having, for example, a thickness of 300 nm is used as the extension inter-layer insulating film 16f.

Then, a selection transistor hole Hs is made by lithography and RIE to pierce the extension inter-layer insulating film 16f and the selection gate electrode film SGf to reach the sacrificial film SF. As illustrated in FIG. 3B, the SiN film forming the sacrificial film SF and the SiN film forming the connection portion CP are removed in, for example, a hot phosphoric acid solution to connect the selection transistor hole Hs, the memory transistor hole Hm, and the hole of the connection portion CP to form a memory string hole Ht having a U-shaped configuration.

As illustrated in FIG. 3C, the first memory unit insulating film 61a made of $SiO_2$, the charge storage layer 63 made of SiN, and the second memory unit insulating film 61b made of $SiO_2$, for example, are stacked on the inner wall face of the memory string hole Ht to form the memory unit stacked film 61.

Then, a semiconductor pillar film SPf forming the semiconductor pillar SP is deposited. A polycrystalline semiconductor film or an amorphous semiconductor film (e.g., an amorphous silicon film of about 7 nm) may be used as the semiconductor pillar film SPf. At this time, the memory string hole Ht is not completely filled, and at least a portion of the interior is left hollow.

Continuing as illustrated in FIG. 3D, annealing is performed, for example, at 600° C. in an inert atmosphere (e.g., $N_2$) to increase the crystallinity of the semiconductor pillar film SPf. Subsequently, annealing is performed again in an oxidation atmosphere to oxidize the side face of the inner side of the semiconductor pillar film SPf. Then, a core unit insulating film 68f forming the core unit 68 is filled into the interior. A SiN film, for example, may be used as the core unit insulating film 68f. Such a SiN film is formed by, for example, CVD (Chemical Vapor Deposition).

Then, as illustrated in FIG. 4A, the core unit insulating film 68f is recessed by performing etch-back with RIE such that an upper end 68fu of the core unit insulating film 68f is on the upper side (the side opposite to the substrate 11) of an upper end SGfu of the selection gate electrode film SGf. Specifically, a distance t1 between the upper end 68fu of the core unit insulating film 68f and the upper end SGfu of the selection gate electrode film SGf in the Z-axis direction is about 100 nm.

Continuing as illustrated in FIG. 4B, impurity implantation is performed on the semiconductor pillar film SPf. The conditions of the impurity implantation may include, for example, phosphorus as the impurity, an acceleration energy of 60 KeV, and an impurity concentration of $1\times10^{15}$ $cm^{-2}$. At this time, the impurity implanted into the core unit insulating film 68f also recoils in the horizontal direction (the direction perpendicular to the Z-axis direction), and the source-drain diffusion region SDR is formed by implanting the impurity into the semiconductor pillar film SPf.

In other words, the implanting (introducing) of the impurity includes irradiating the impurity on the recessed core unit 68 (the core unit insulating film 68f), causing a travel direction of the impurity to have a component in a direction orthogonal to the first direction (the Z-axis direction), and introducing the impurity into the semiconductor film (the semiconductor pillar film SPf).

Then, as illustrated in FIG. 4C, pre-processing with a dilute hydrofluoric acid solution is performed. Subsequently, a phosphorus-doped polysilicon film 18f forming the first conducting layer 18 is filled onto the core unit insulating film 68f in the selection transistor hole Hs. Subsequently, the polysilicon film (the semiconductor pillar film SPf) on the extension inter-layer insulating film 16f is removed.

In other words, the first conducting layer 18 is formed to contact the core unit (the core unit insulating film 68f) by filling a conducting material onto the semiconductor film (the semiconductor pillar film SPf) including the introduced impurity in the through-hole (the selection transistor hole Hs or the memory string hole Ht).

At this time, impurity implantation may be performed into the phosphorous-doped polysilicon film 18f to make the contact with the metal plug 21 more reliably. In such a case, the conditions of the impurity implantation may include, for example, an impurity of As, an acceleration energy of 40 KeV, and an impurity concentration of $1\times10^{15}$ $cm^{-2}$.

Further, annealing is performed, for example, in a $N_2$ atmosphere at 950° C. for about 10 seconds to activate the impurity.

Subsequently, the memory unit stacked film 61 on the extension inter-layer insulating film 16f is removed. Then, an inter-layer insulating film 19 is deposited thereupon. A trench 20 is made in the inter-layer insulating film 19. Then, a metal film such as a stacked film of, for example, a W film 21b or a TiN film 21a is filled into the trench 20 to form the metal plug 21.

Thus, the nonvolatile semiconductor memory device 111 illustrated in FIGS. 1A and 1B can be constructed.

The nonvolatile semiconductor memory device 111 provides effects such as those recited below.

First, because the core unit insulating film 68f is recessed such that the impurity implantation is performed in a state in which the upper end 68fu of the core unit insulating film 68f is proximal to the selection gate electrode SG, the acceleration energy during the impurity implantation can be relatively low, and it is easy to increase the current during the impurity implantation. In other words, a low acceleration energy and a high current can be used. Thereby, the time necessary for the step of impurity implantation can be reduced, and manufacturing costs can be reduced.

Because the distance to the selection gate electrode SG during the impurity implantation is reduced, the impurity can be implanted at a high concentration, and the controllability of the impurity concentration in the Z-axis direction is high.

Thus, the nonvolatile semiconductor memory device 111 can be applied to a hollow cylindrical semiconductor pillar to realize a high-concentration source-drain diffusion layer having high positional controllability at low manufacturing costs.

In the case where conventional methods are used with a semiconductor pillar SP having a thin hollow cylindrical configuration in which the thickness of the semiconductor pillar film SPf is several nanometers, voids and the like occur during a silicide reaction at the interface when connecting the metal plug 21 to the semiconductor pillar film SPf, and open defects easily occur. However, such problems are solved by the nonvolatile semiconductor memory device 111. In other words, in the nonvolatile semiconductor memory device 111, the side face of the semiconductor pillar film SPf (the semiconductor pillar SP) and the side face of the phosphorous-doped polysilicon film 18f (the first conducting layer 18) contact each other with a large surface area even in the case where the semiconductor pillar film SPf is thin, and the semiconductor pillar SP can be stably electrically connected to the first conducting layer 18. The metal plug 21 contacts the semiconductor pillar SP and the first conducting layer 18 with the surface area corresponding to the diameter of the memory string hole Ht. Also, such contact is a metal-polysilicon contact which easily provides stable connection characteristics. Thereby, effects are provided that the open defects recited above can be reduced and the yield improves.

Although ion implantation such as that recited above may be used in the step described in regard to FIG. 4B, vapor phase diffusion of the impurity, for example, also may be used. In other words, as illustrated in FIG. 4B, a SiN film having a high heat resistance is used as the core unit insulating film 68f when implanting the impurity into the semiconductor pillar film SPf, and such a configuration can also withstand the high-temperature processing of vapor phase diffusion.

Second Example

FIGS. 5A to 5C are schematic cross-sectional views illustrating the configuration of a nonvolatile semiconductor memory device and a method for manufacturing the same according to a second example of the invention.

Namely, FIG. 5A is a schematic cross-sectional view illustrating the configuration of the nonvolatile semiconductor memory device. FIGS. 5B and 5C are schematic cross-sectional views in order of the steps, illustrating the method for manufacturing the same.

In a nonvolatile semiconductor memory device 112 of the second example according to the first embodiment of the invention, the upper end of the core unit 68 is disposed between the upper end and the lower end of the selection gate electrode SG on the upper end side of the selection gate electrode SG as illustrated in FIG. 5A. The lower end of the first conducting layer 18 faces the selection gate electrode SG.

Such a nonvolatile semiconductor memory device 112 may be manufactured, for example, as follows.

After implementing the processing illustrated in FIGS. 3A to 3D to fill the core unit insulating film 68f forming the core unit 68 into the interior of the inner side of the semiconductor pillar film SPf, etch-back is performed on the core unit insulating film 68f by, for example, RIE as illustrated in FIG. 5B such that the upper end 68fu of the core unit insulating film 68f is recessed below (to the substrate 11 side) of the upper end SGfu of the selection gate electrode film SGf. In this specific example, a distance t2 between the upper end 68fu of the core unit insulating film 68f and the upper end SGfu of the selection gate electrode film SGf in the Z-axis direction is, for example, about 50 nm.

As illustrated in FIG. 5C, pre-processing in a dilute hydrofluoric acid solution is performed. Subsequently, the phosphorous-doped polysilicon film 18f is filled onto the core unit insulating film 68f in the selection transistor hole Hs. Then, the polysilicon film (the semiconductor pillar film SPf) on the extension inter-layer insulating film 16f is removed. In other words, in this manufacturing method, the impurity implantation processing described in regard to FIG. 4B is omitted.

At this time, the impurity implantation may be performed into the phosphorous-doped polysilicon film 18f to make the contact with the metal plug 21 more reliable. In such a case, the conditions of the impurity implantation may include, for example, an impurity of As, an acceleration energy of 40 KeV, and an impurity concentration of $1 \times 10^{15}$ cm$^{-2}$.

Further, annealing is performed, for example, in a $N_2$ atmosphere at 950° C. for about 10 seconds to activate the impurity.

Thereafter, the inter-layer insulating film 19 and the metal plug 21 are formed similarly to those of the first example, and the nonvolatile semiconductor memory device 112 illustrated in FIG. 5A can be constructed.

The nonvolatile semiconductor memory device 112 provides effects such as those recited below.

In the nonvolatile semiconductor memory device 111 according to the first example, the source-drain diffusion region SDR opposing to the selection gate electrode SG is formed by the impurity implantation described in regard to FIG. 4B. Conversely, in the nonvolatile semiconductor memory device 112 according to the second example, the source-drain diffusion region SDR is formed by lowering the phosphorous-doped polysilicon film 18f to a position opposing to the selection gate electrode SG. The impurity in the phosphorous-doped polysilicon film 18f is introduced into the semiconductor pillar film SPf at a prescribed concentration by, for example, diffusion during activation annealing. Thereby, the manufacturing steps of the semiconductor device are reduced, and further cost reductions are possible.

Third Example

FIGS. 6A to 6D are schematic cross-sectional views illustrating the configuration of a nonvolatile semiconductor memory device and a method for manufacturing the same according to a third example of the invention.

Figure 7C:
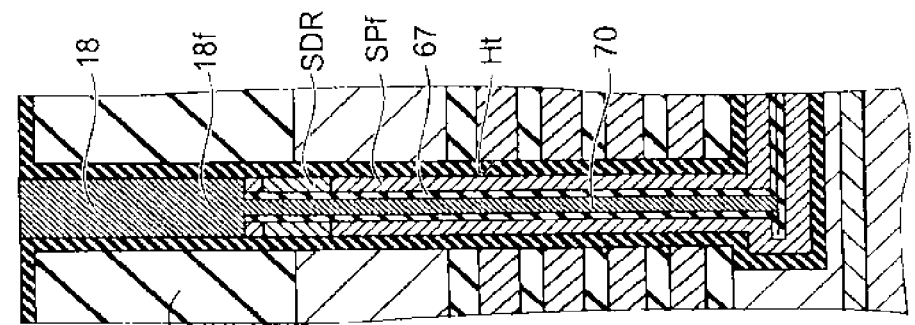
FIGS. 7A to 7C are schematic cross-sectional views in order of the processes, continuing from FIG. 6D.
Figure 7B:
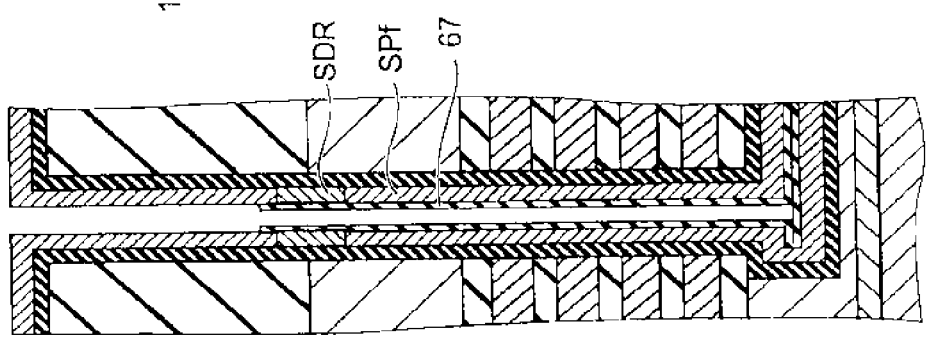
Figure 7A:
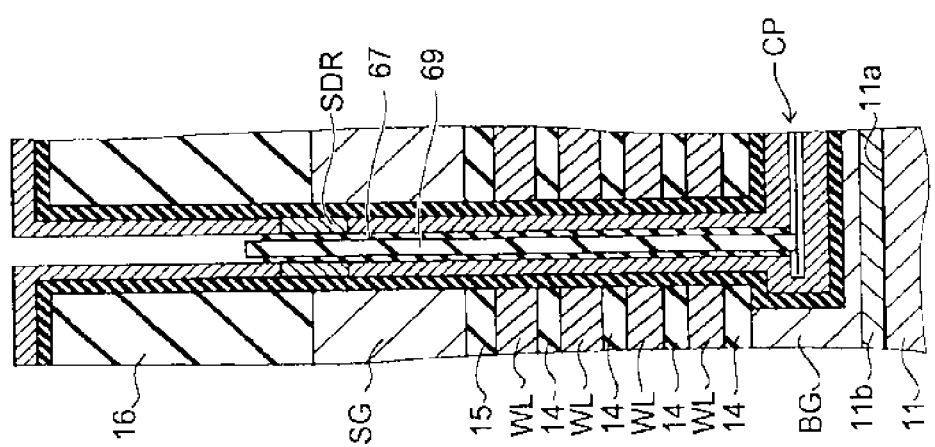

Namely, FIG. 6A is a schematic cross-sectional view illustrating the configuration of the nonvolatile semiconductor memory device. FIGS. 6B, 6C, and 6D are schematic cross-sectional views in order of the steps, illustrating the method for manufacturing the same. FIGS. 7A to 7C are schematic cross-sectional views in order of the steps, continuing from FIG. 6D.

In a nonvolatile semiconductor memory device 113 of the third example according to the first embodiment of the invention illustrated in FIG. 6A, a barrier insulating film 67 made of, for example, SiN is provided on the wall face of the inner side of the semiconductor pillar SP. A second conducting layer 70 is provided on the inner side of the barrier insulating film 67.

In other words, in the nonvolatile semiconductor memory device 113, the core unit 68 includes the barrier insulating film 67 provided on the side wall of the semiconductor pillar SP and the second conducting layer 70 filled onto the inner side of the barrier insulating film 67 to electrically connect to the first conducting layer 18. The same material as the first conducting layer 18 may be used as the second conducting layer 70.

In such a case, the depth of the connection portion CP is made shallower than those of the examples hereinabove, and the second conducting layer 70 does not pass through the connection portion CP in the horizontal direction. Thereby, the second conducting layer 70 is prevented from causing shorts between the bit line BL and the source line SL, and highly reliable reading operations can be realized while using the same material as the first y conducting layer 18 to reduce steps.

Such a nonvolatile semiconductor memory device 113 may be manufactured, for example, as follows.

After implementing the processing illustrated in FIGS. 3A to 3C to form the memory unit stacked film 61 and the semiconductor pillar film SPf on the inner wall face of the memory string hole Ht, annealing is performed at, for example, 600° C. in an inert atmosphere (e.g., in $N_2$) to increase the crystallinity of the semiconductor pillar film SPf as illustrated in FIG. 6B. Then, the side face of the inner side of the semiconductor pillar film SPf is oxidized by annealing in an oxidation atmosphere; the barrier insulating film 67 is deposited on the wall face of the inner side of the semiconductor pillar film SPf; and a coated sacrificial film 69 is filled into the remaining space on the inner side of the barrier insulating film 67.

A SiN film, for example, may be used as the barrier insulating film 67 recited above. The thickness of the barrier insulating film 67 may be, for example, about 5 nm. At this time, the barrier insulating film 67 does not completely fill the memory string hole Ht. In other words, the barrier insulating film 67 does not completely fill the interior of the memory string hole Ht proximal to at least the selection gate electrode SG. Thereby, the coated sacrificial film 69 recited above is formed on the inner side of the barrier insulating film 67 in the interior of the memory string hole Ht. A photoresist, for example, may be used as the coated sacrificial film 69.

Then, as illustrated in FIG. 6C, etch-back is performed on the coated sacrificial film 69 by RIE such that an upper end 69u of the coated sacrificial film 69 of the interior of the memory string hole Ht is above the upper end SGfu of the selection gate electrode film SGf. A distance t3 from the upper end 69u of the coated sacrificial film 69 to the upper end SGfu of the selection gate electrode film SGf is about 100 nm.

Continuing as illustrated in FIG. 6D, the barrier insulating film 67 of the upper portion of the memory string hole Ht (above the selection gate electrode SG) is removed by CDE (chemical dry etching) based on, for example, $CF_4$ gas.

Then, as illustrated in FIG. 7A, impurity implantation is performed on the semiconductor pillar film SPf. The conditions of the impurity implantation may include, for example, phosphorus as the impurity, an acceleration energy of 60 KeV, and an impurity concentration of $1\times10^{15}$ cm$^{-2}$. At this time, the impurity implanted into the coated sacrificial film 69 and the barrier insulating film 67 also recoils in the horizontal direction (the direction perpendicular to the Z-axis direction) and is implanted into the semiconductor pillar film SPf to form the source-drain diffusion region SDR.

Continuing as illustrated in FIG. 7B, the coated sacrificial film 69 is removed by, for example, ashing and wet processing.

Then, as illustrated in FIG. 7C, pre-processing with a dilute hydrofluoric acid solution, for example, is performed. Subsequently, the phosphorus-doped polysilicon film 18f is filled. At this time, the phosphorous-doped polysilicon film 18f buried in the inner side of the barrier insulating film 67 in the interior of the memory string hole Ht forms the second conducting layer 70; and above the selection gate electrode film SGf, the phosphorous-doped polysilicon film 18f filled into the space of the interior of the memory string hole Ht forms the first conducting layer 18. In other words, the same material may be used as the second conducting layer 70 and the first conducting layer 18.

Subsequently, the polysilicon film (the semiconductor pillar film SPf) on the extension inter-layer insulating film 16f is removed.

At this time, impurity implantation may be performed into the phosphorous-doped polysilicon film 18f to make the contact with the metal plug more reliable. In such a case, the conditions of the impurity implantation may include, for example, an impurity of As, an acceleration energy of 40 KeV, and an impurity concentration of $1\times10^{15}$ cm$^{-2}$.

Further, annealing is performed, for example, in a $N_2$ atmosphere at 950° C. for about 10 seconds to activate the impurity.

Thereafter, the inter-layer insulating film 19 and the metal plug 21 are formed similarly to those of the first example, and the nonvolatile semiconductor memory device 113 illustrated in FIG. 6A can be constructed.

The nonvolatile semiconductor memory device 113 provides effects such as those recited below.

In the nonvolatile semiconductor memory device 113, the SiN film of the barrier insulating film 67 is formed with a thin film thickness without completely filling the memory string hole Ht. The barrier insulating film 67 prevents the phosphorous-doped polysilicon film 18f from directly contacting the semiconductor pillar film SPf. The height of the upper end of the barrier insulating film 67 is determined by the recessed depth of the resist, i.e., the coated sacrificial film 69. Unlike films grown by CVD, voids and seams generally do not occur easily during filling in the case of a coated film. Therefore, using the coated sacrificial film 69 makes it difficult for voids to occur in the center of the memory string hole during the step of recessing in the case where the downscaling of memory progresses; and the height of the upper end 69u of the coated sacrificial film 69 can be recessed with good controllability in the next step. Thereby, the controllability of the ion implantation step can be improved and the barrier insulating film 67 can be reliably left in the semiconductor pillar. Therefore, the phosphorous-doped polysilicon film 18f no longer contacts the semiconductor pillar of the memory transistor portion, and the transistor characteristics also can be improved.

Although ion implantation such as that recited above may be used in the step described in regard to FIG. 7A, impurity vapor phase diffusion, for example, may be performed instead of the ion implantation after removing the coated sacrificial film 69.

Although in this example the same material is used as the second conducting layer 70 and the first conducting layer 18 and highly reliable reading operations can be realized while reducing the number of steps because the depth of the connection portion CP is made shallow such that the second conducting layer 70 does not pass through the connection portion CP in the horizontal direction, in the case of a structure in which the depth of the connection portion CP is deep and another material is filled into the space on the inner side of the barrier insulating film 67, such a material may be insulative unlike the first conducting layer 18 to prevent conduction through the connection portion CP in the horizontal direction.

Thus, in the nonvolatile semiconductor memory device 113, the first core unit includes the first barrier insulating film provided on the side wall of the first semiconductor pillar SP1 and the second conducting layer of the first semiconductor pillar SP1 filled onto the inner side of the first barrier insulating film to connect to the first conducting layer of the first semiconductor pillar SP1; and the second core unit includes the second barrier insulating film provided on the side wall of the second semiconductor pillar SP2 and the second conducting layer of the second semiconductor pillar SP2 filled onto the inner side of the second barrier insulating film to connect to the first conducting layer of the second semiconductor pillar SP2. The first barrier insulating film and the second barrier insulating film are aligned in the interior of the connection portion CP and connected to each other in the connection portion CP. The second conducting layer of the first semiconductor pillar SP1 and the second conducting layer of the second semiconductor pillar SP2 are substantially not provided in the interior of the connection portion CP.

Fourth Example

FIGS. 8A to 8D are schematic cross-sectional views illustrating the configuration of a nonvolatile semiconductor memory device and a method for manufacturing the same according to a fourth example of the invention.

Namely, FIG. 8A is a schematic cross-sectional view illustrating the configuration of the nonvolatile semiconductor memory device. FIGS. 8B, 8C, and 8D are schematic cross-sectional views in order of the steps, illustrating the method for manufacturing the same.

As illustrated in FIG. 8A, an oxygenated amorphous silicon film 71 is used as the core unit 68 instead of SiN in a nonvolatile semiconductor memory device 114 of the fourth example according to the first embodiment of the invention. Thereby, the position of the upper end of the core unit 68 can be controlled with high precision. In this specific example, the height of the upper end of the semiconductor pillar SP substantially equals to the height of the upper end of the core unit 68. Accordingly, the first conducting layer 18 is provided on the core unit 68 (in the Z-axis direction) where the first conducting layer 18 is provided on the semiconductor pillar SP (in the Z-axis direction).

Such a nonvolatile semiconductor memory device 114 can be manufactured, for example, as follows.

First, the processing illustrated in FIGS. 3A to 3C are implemented to form the memory unit stacked film 61 and the semiconductor pillar film SPf on the inner wall face of the memory string hole Ht.

Subsequently, as illustrated in FIG. 8B, annealing is performed, for example, at 600° C. in an inert atmosphere (e.g., in $N_2$) to increase the crystallinity of the semiconductor pillar film SPf. Subsequently, annealing is performed in an oxidation atmosphere to oxidize the side face of the inner side of the semiconductor pillar film SPf. Then, the barrier insulating film 67 is deposited on the inner side of the semiconductor pillar film SPf, and the oxygenated amorphous silicon film 71 is filled into the interior thereof.

Then, as illustrated in FIG. 8C, the semiconductor pillar film SPf and the oxygenated amorphous silicon film 71 are recessed by performing etch-back on the oxygenated amorphous silicon film 71 by RIE similarly to the first example such that an upper end 71u of the oxygenated amorphous silicon film 71 is on the upper side of the upper end SGfu of the selection gate electrode film SGf by a distance of about 100 nm. Specifically, a distance t1 between the upper end 68fu of the core unit insulating film 68f and the upper end SGfu of the selection gate electrode film SGf in the Z-axis direction is about 100 nm.

Continuing as illustrated in FIG. 8D, impurity implantation is performed on the semiconductor pillar film SPf similarly to the first example to form the source-drain diffusion region SDR.

Subsequently, the phosphorous-doped polysilicon film 18f, the inter-layer insulating film 19, and the metal plug 21 are formed similarly to those of the first example, and the nonvolatile semiconductor memory device 114 illustrated in FIG. 8A can be constructed.

The nonvolatile semiconductor memory device 114 provides effects such as those recited below.

The nonvolatile semiconductor memory device 114 differs from the nonvolatile semiconductor memory device 111 in that the oxygenated amorphous silicon film 71 is used instead of SiN as the core unit 68. Therefore, the oxygenated amorphous silicon film 71 and the semiconductor pillar film SPf are etched at substantially the same etching rate when recessing the oxygenated amorphous silicon film 71 illustrated in FIG. 8C. Thereby, the upper end 71u of the oxygenated amorphous silicon film 71 and the upper end of the semiconductor pillar film SPf can be formed at substantially the same height after recessing.

In other words, the upper end of the semiconductor pillar film SPf can be set at the prescribed height (i.e., in this case, proximal to the upper side of the upper end of the selection gate electrode SG) during the impurity implantation into the semiconductor pillar film SPf, and the height of the upper end of the core unit 68 can be set substantially to the same height. Thereby, the efficiency of implanting during the impurity implantation increases, and a low-cost semiconductor device with stable operations can be realized.

Fifth Example

FIGS. 9A to 9C are schematic cross-sectional views illustrating the configuration of a nonvolatile semiconductor memory device and a method for manufacturing the same according to a fifth example of the invention.

Namely, FIG. 9A is a schematic cross-sectional view illustrating the configuration of the nonvolatile semiconductor memory device. FIGS. 9B and 9C are schematic cross-sectional views in order of the steps, illustrating the method for manufacturing the same.

Figure 10C:
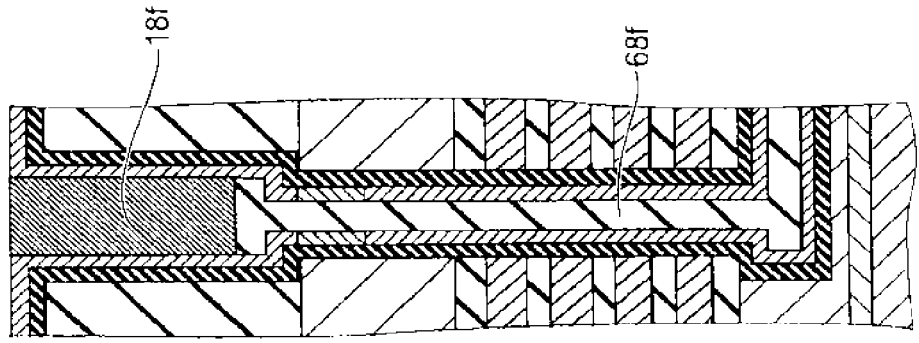
FIGS. 10A to 10C are schematic cross-sectional views in order of the processes, continuing from FIG. 9C.
Figure 10B:
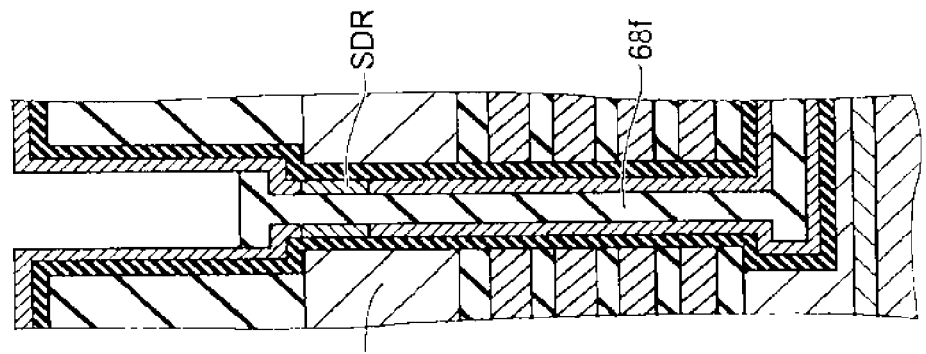
Figure 10A:
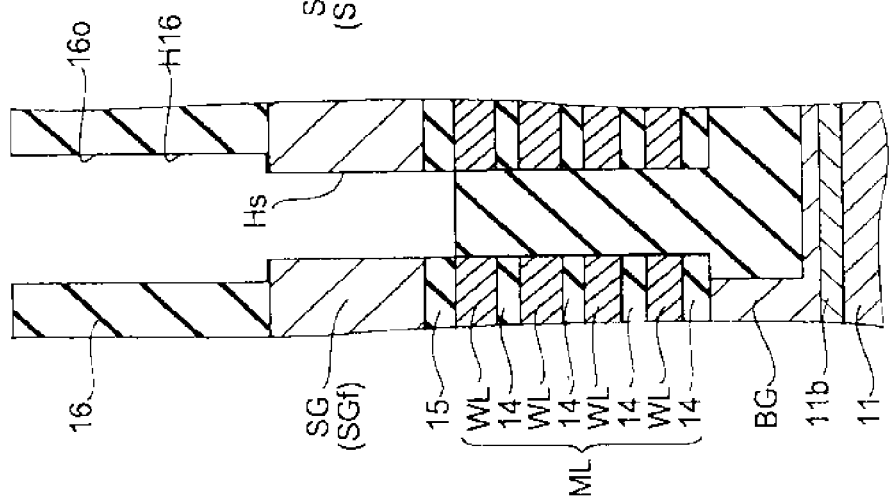

FIGS. 10A to 10C are schematic cross-sectional views in order of the steps, continuing from FIG. 9C.

As illustrated in FIG. 9A, the diameter of the semiconductor pillar SP of a nonvolatile semiconductor memory device 115 of the fifth example according to the first embodiment of the invention is larger for the portion piercing the insulating layer 16 than for the portion piercing the stacked structural unit ML and the selection gate electrode SG.

In other words, the diameter of the semiconductor pillar SP opposing to the upper end of the insulating layer 16 is larger than the diameter of the semiconductor pillar SP opposing to the selection gate electrode SG. By such a structure, a portion of the semiconductor pillar SP proximal to the upper end of the portion opposing to the selection gate electrode SG is exposed during the impurity implantation into the semiconductor pillar film SPf, and the efficiency of the impurity implantation can be increased.

Such a nonvolatile semiconductor memory device 115 can be manufactured, for example, as follows.

First, as illustrated in FIG. 9B, the memory transistor hole Hm is made in the stacked structural unit ML and a portion of the back gate BG to align in the Z-axis direction. The sacrificial film SF made of, for example, a SiN film is filled into the interior of the memory transistor hole Hm. Thereupon, the inter-layer insulating film 15, the selection gate electrode film SGf, and the extension inter-layer insulating film 16f are stacked. An opening 16o is made in the extension inter-layer insulating film 16f by lithography and RIE.

Then, a sacrificial film is deposited on the inner side of the opening 16o and the sacrificial film is etched by RIE to form a spacer sacrificial film 16s on the side wall of the opening 16O. A boron-doped silicate glass film, for example, may be used as the spacer sacrificial film 16s. The spacer sacrificial film 16s may have a thickness of, for example, 10 nm.

Continuing as illustrated in FIG. 9C, the selection transistor hole Hs is made, for example, by RIE to pierce the selection gate electrode film SGf to reach the sacrificial film SF.

Then, as illustrated in FIG. 10A, the spacer sacrificial film 16s is removed, for example, in a hydrofluoric acid vapor at 70° C.

Subsequently, the memory string hole Ht having a U-shaped configuration is made similarly to the steps described in regard to FIGS. 3B to 3D and FIG. 4A. The memory unit stacked film 61 is formed on the inner wall face of the memory string hole Ht. The core unit insulating film 68f is filled into the interior thereof, and etch-back is performed on the core unit insulating film 68f. In other words, the upper end 68fu of the core unit insulating film 68f is positioned about 100 nm on the upper side of the upper end SGfu of the selection gate electrode film SGf.

Then, as illustrated in FIG. 10B, channel impurity implantation is performed to adjust the threshold of the selection transistor, and source-drain diffusion layer impurity implantation also is performed. The conditions of the channel impurity implantation may include, for example, boron as the impurity, an acceleration energy of 60 KeV, and an impurity concentration of $3\times10^{14}$ cm$^{-2}$. On the other hand, the conditions of the source-drain diffusion layer impurity implantation may include, for example, phosphorus as the impurity, an acceleration energy of 60 KeV, and an impurity concentration of $1\times10^{15}$ cm$^{-2}$. Thus, the impurity concentration of the channel is adjusted and the source-drain diffusion region SDR is formed.

Continuing as illustrated in FIG. 10C, the phosphorous-doped polysilicon film 18f is filled onto the core unit insulating film 68f in the selection transistor hole Hs. Subsequently, the polysilicon film (the semiconductor pillar film SPf) is removed from the extension inter-layer insulating film 16f.

Subsequently, the inter-layer insulating film 19 and the metal plug 21 are formed similarly to those of the first example, and the nonvolatile semiconductor memory device 115 illustrated in FIG. 9A can be constructed.

The nonvolatile semiconductor memory device 115 provides effects such as those recited below.

By implementing the steps illustrated in FIG. 9B, FIG. 9C, and FIG. 10A and by using the spacer sacrificial film 16s, the diameter of an extension inter-layer insulating film hole H16 piercing the extension inter-layer insulating film 16f is larger than the diameter of the selection transistor hole Hs piercing the selection gate electrode SG. Thereby, the semiconductor pillar film SPf proximal to the selection gate electrode SG is exposed upward as viewed from above in the Z-axis direction in the step illustrated in FIG. 10B; and during the impurity implantation having a perpendicular incidence, the impurity can be implanted into the semiconductor pillar film SPf directly instead of by recoiling in the horizontal direction.

Thereby, the nonvolatile semiconductor memory device 115 provides the effect of drastically increasing the efficiency of the impurity implantation compared to the nonvolatile semiconductor memory device 111, and the effects of reducing the process time for the impurity implantation and reducing costs are provided. The effect provided by the nonvolatile semiconductor memory device 115 over the nonvolatile semiconductor memory device 111 in regard to increasing the efficiency of the impurity implantation is estimated to be at least by a factor of ten.

Also, it is possible to implant the impurity into the channel portion as recited above in the step illustrated in FIG. 10B. In other words, although the impurity implantation to the channel portion which is in a portion deeper than the source-drain diffusion region SDR requires implantation technology with a higher rate and higher current, the efficiency can be increased by implanting the impurity directly into the channel portion instead of by recoiling as recited above, and it is possible to introduce the impurity into the channel portion to adjust the threshold.

While it is conceivable to use a phosphorus-doped polysilicon film as the semiconductor pillar film SPf to increase the signal magnitude from the memory string (i.e., to increase the cell current), in such a case as well, it is desirable to maintain the threshold of the selection transistor in a positive range to reduce the circuit surface area as much as possible. According to the nonvolatile semiconductor memory device 115 according to this example, it is possible to increase the cell current while suppressing the increase of the circuit surface area by performing a compensation implantation of boron into the channel portion, and a low-cost semiconductor device having stable operations can be realized.

Sixth Example

Figure 11:
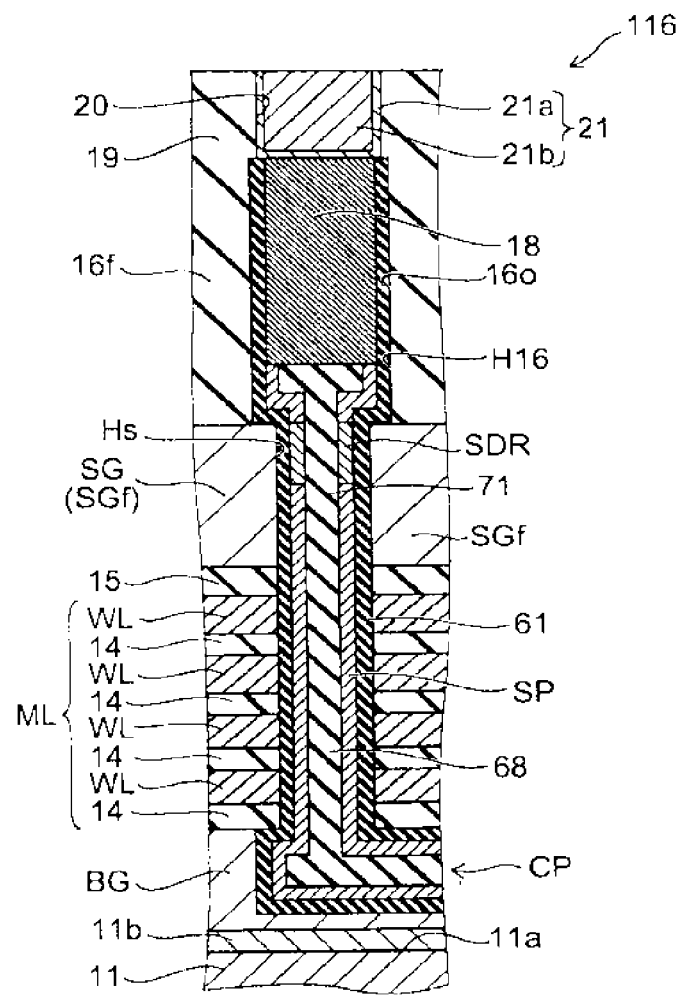
FIG. 11 is a schematic cross-sectional view illustrating the configuration of a nonvolatile semiconductor memory device according to a sixth example of the invention.

FIG. 11 is a schematic cross-sectional view illustrating the configuration of a nonvolatile semiconductor memory device according to a sixth example of the invention.

As illustrated in FIG. 11, a nonvolatile semiconductor memory device 116 of the sixth example according to the first embodiment of the invention is similar to the nonvolatile semiconductor memory device 115 in that the diameter of the extension inter-layer insulating film hole H16 piercing the extension inter-layer insulating film 16f is larger than the diameter of the selection transistor hole Hs piercing the selection gate electrode SG. In other words, the diameter of the semiconductor pillar SP opposing to the upper end of the insulating layer 16 is larger than the diameter of the semiconductor pillar SP opposing to the selection gate electrode SG. The oxygenated amorphous silicon film 71 described in regard to the fourth example is used as the core unit 68.

Thereby, the sixth example provides both the effects described in regard to the fifth example and the effects described in regard to the fourth example.

Figure 12:
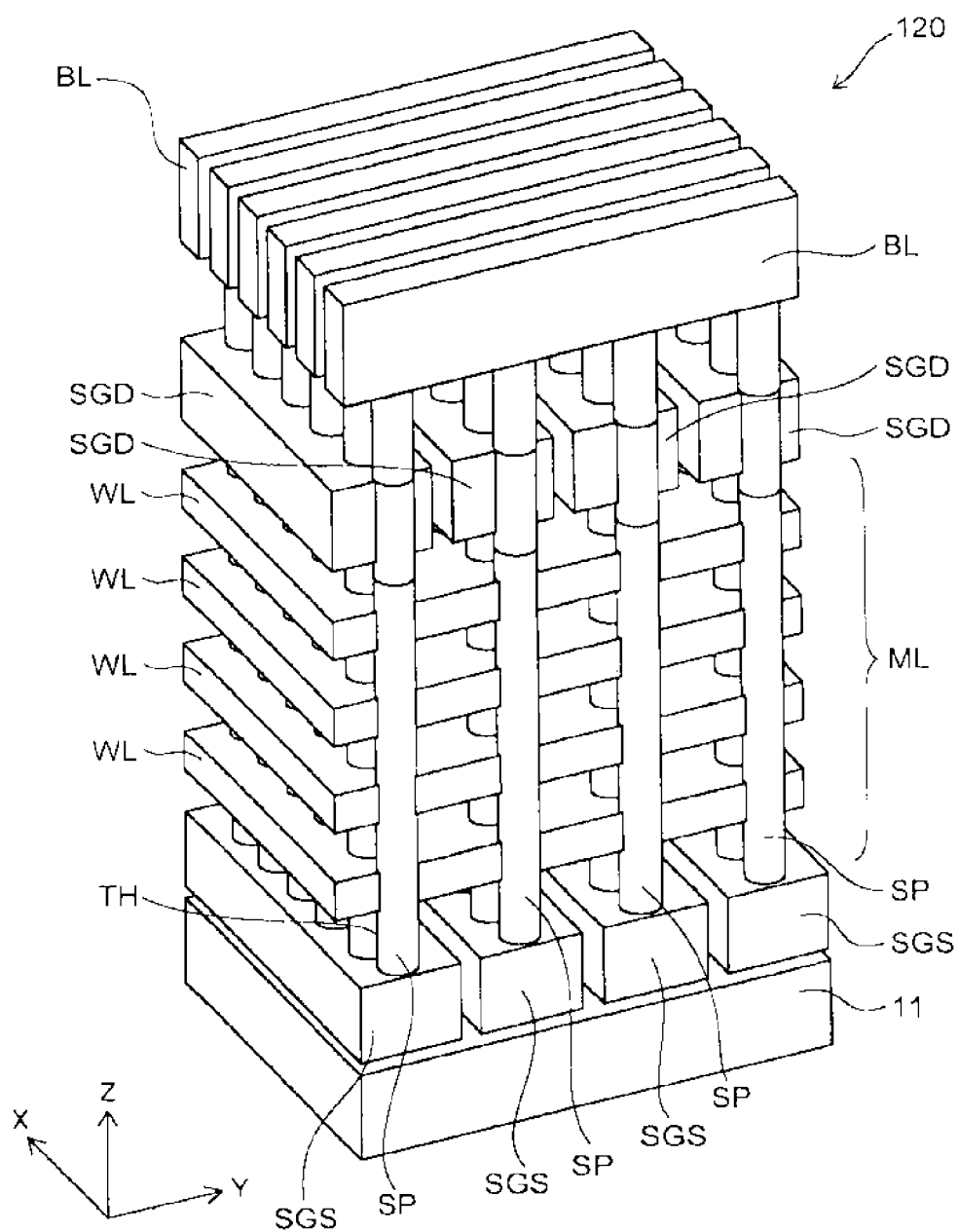
FIG. 12 is a schematic perspective view illustrating the configuration of another nonvolatile semiconductor memory device according to the first embodiment of the invention.

FIG. 12 is a schematic perspective view illustrating the configuration of another nonvolatile semiconductor memory device according to the first embodiment of the invention.

In FIG. 12 as well, only the electrically conducting portions are illustrated, and the insulating portions are omitted.

As illustrated in FIG. 12, another nonvolatile semiconductor memory device 120 according to this embodiment also includes the semiconductor pillars SP piercing the stacked structural unit ML in the Z-axis direction is provided, where the stacked structural unit ML includes the electrode films WL stacked with the insulating films 14 (not illustrated).

In such a case, each of the semiconductor pillars SP is independent. A source-side selection gate electrode SGS is provided on the substrate 11 side of the semiconductor pillar SP. A drain-side selection gate electrode SGD is provided on the side of the semiconductor pillar SP above the stacked structural unit ML. Each of the source-side selection gate electrode SGS and the drain-side selection gate electrode SGD is, for example, divided along the Y-axis direction to be aligned in the X-axis direction. Each of the semiconductor pillars SP is selected by these two selection gates.

In such a case, the electrode films WL may be continuous in the XY plane and need not be separated into an inter digital electrode structure as in the nonvolatile semiconductor memory device 110 described above.

The nonvolatile semiconductor memory device 120 having such a structure may include the configuration including the drain-side selection gate electrode SGD of the upper side and the insulating layer 16 provided thereupon from any of the configurations described in regard to the examples recited above or any combination of such configurations within the extent of technical feasibility.

Second Embodiment

Figure 13:
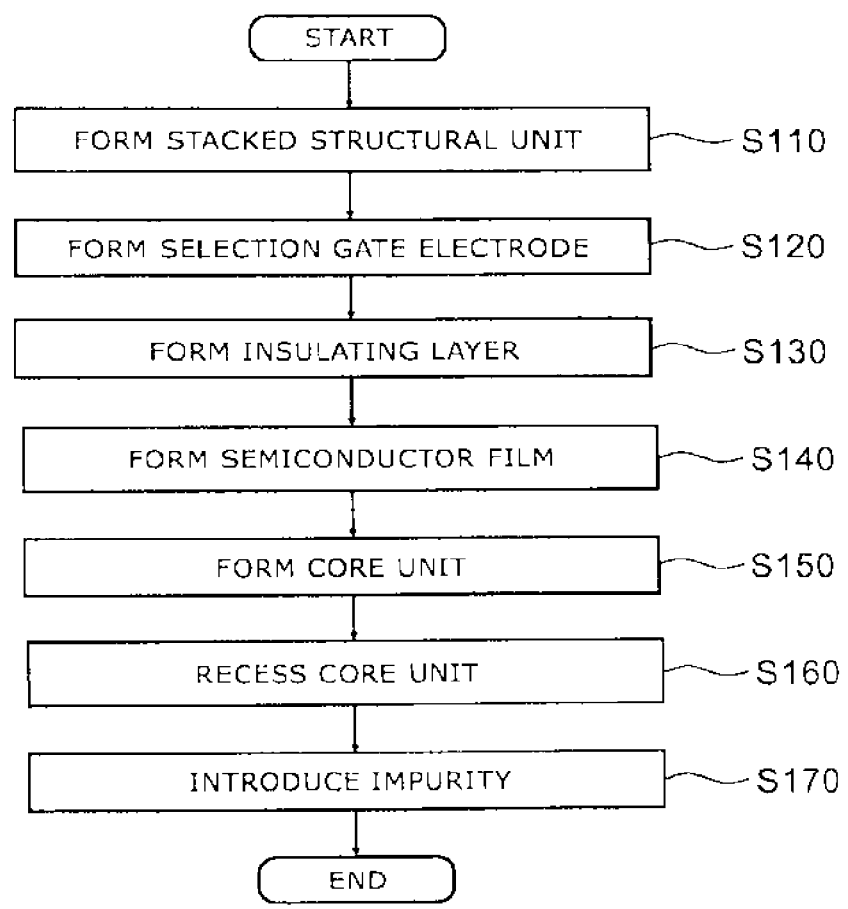
FIG. 13 is a flowchart illustrating a method for manufacturing a nonvolatile semiconductor memory device according to a second embodiment of the invention.

FIG. 13 is a flowchart illustrating a method for manufacturing a nonvolatile semiconductor memory device according to a second embodiment of the invention.

As illustrated in FIG. 13, in the method for manufacturing the nonvolatile semiconductor memory device according to this embodiment, first, the stacked structural unit ML including the insulating films 14 alternately stacked with the electrode films WL is formed on the major surface 11a of the substrate 11 (step S110). Then, the selection gate electrode film SGf is formed on the stacked structural unit ML (step S120). Then, the insulating layer 16 is formed on the selection gate electrode SG (step S130).

Continuing, the first through-hole (the selection transistor hole Hs or the memory string hole Ht) piercing at least the selection gate electrode SG and the insulating layer 16 in the first direction (the Z-axis direction) perpendicular to the major surface 11a is made, and a semiconductor film (the semiconductor pillar film SPf) is formed on the inner side face of the first through-hole (step S140).

Then, the core unit 68 is formed on the inner side of the semiconductor film (step S150). Then, the core unit 68 is recessed (step S160).

In step S110 to step S160 recited above, for example, the processing described in regard to FIG. 3A to FIG. 4A is performed.

Then, an impurity is introduced into the semiconductor film (step S170).

In other words, for example, the impurity implantation described in regard to FIG. 4B, the diffusing described in regard to FIG. 5C, etc., are implemented.

In this manufacturing method, the distance to the selection gate electrode SG during the impurity implantation is reduced by recessing the core unit 68; the impurity can be implanted with a high concentration; and the controllability of the impurity concentration is high. Methods that introduce the impurity by diffusing can further simplify the steps.

This manufacturing method may be applied to a hollow cylindrical semiconductor pillar to provide a method for manufacturing the nonvolatile semiconductor memory device that realizes a high-concentration source-drain diffusion layer having high position controllability with low manufacturing costs.

Figure 14:
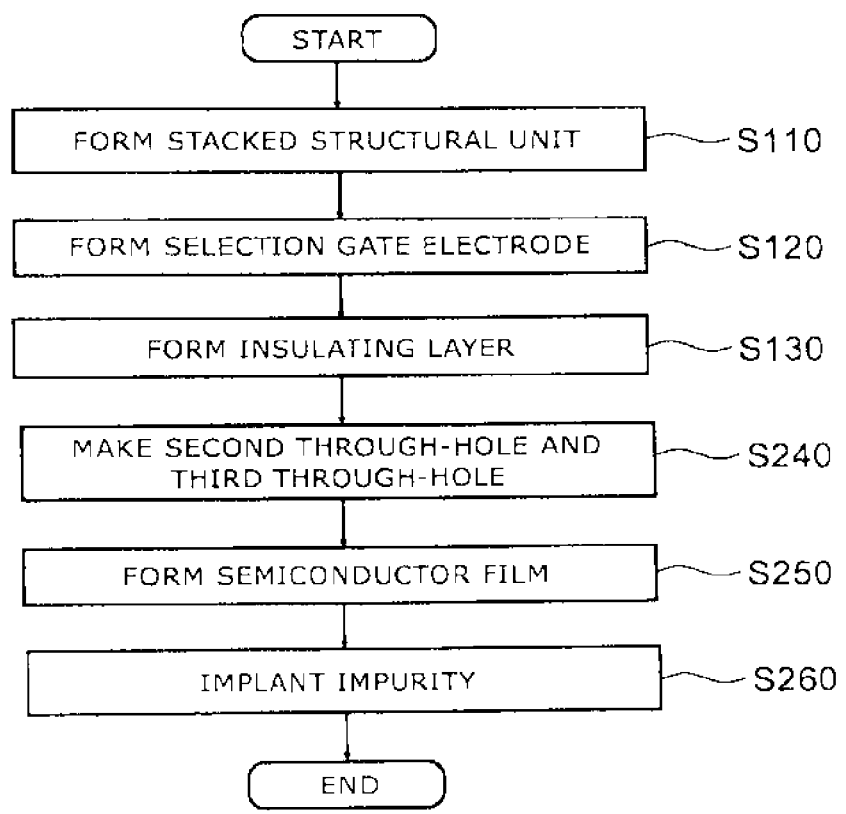
FIG. 14 is a flowchart illustrating another method for manufacturing the nonvolatile semiconductor memory device according to the second embodiment of the invention.

FIG. 14 is a flowchart illustrating another method for manufacturing the nonvolatile semiconductor memory device according to the second embodiment of the invention.

As illustrated in FIG. 14, in another method for manufacturing the nonvolatile semiconductor memory device according to this embodiment, first, the stacked structural unit ML including the insulating films 14 alternately stacked with the electrode films WL is formed on the major surface 11a of the substrate 11 (step S110).

Then, the selection gate electrode SG is formed on the stacked structural unit ML (step S120). Then, the insulating layer 16 is formed on the selection gate electrode SG (step S130).

In step S110 to step S160 recited above, for example, a portion of the processing described in regard to FIG. 3A is performed.

Then, the second through-hole (the selection transistor hole Hs) piercing the selection gate electrode SG in the first direction perpendicular to the major surface 11a is made; and the third through-hole (the extension inter-layer insulating film hole H16) piercing the insulating layer 16 in the first direction to communicate with the second through-hole is made, where the diameter of the third through-hole at the upper end of the insulating layer 16 is larger than that of the second through-hole (step S240).

In other words, for example, the processing described in regard to FIG. 9B, FIG. 9C, and FIG. 10A is performed.

Then, a semiconductor film (the semiconductor pillar film SPf) is formed on the inner side faces of the first through-hole and the second through-hole (step S250).

In other words, for example, a portion of the processing described in regard to FIG. 10B is performed.

Continuing, an impurity is implanted into a portion of the semiconductor film on the selection gate electrode SG side (step S260).

In other words, for example, another portion of the processing described in regard to FIG. 10B is performed.

According to this manufacturing method, the semiconductor pillar film SPf proximal to the selection gate electrode SG is exposed upward; and during the impurity implantation having a perpendicular incidence, the impurity can be directly implanted into the semiconductor pillar film SPf, and the efficiency of the impurity implantation can be drastically increased. Also, it is possible to implant the impurity into the channel portion to adjust the threshold; and by performing, for example, a compensation implantation of boron into the channel portion, the cell current can be increased while suppressing the increase of the circuit surface area, and stable operations can be realized.

Thus, according to the nonvolatile semiconductor memory device and the method for manufacturing the same according to the embodiments of the invention, the source-drain diffusion layer can be stably formed at the end of the selection gate electrode SG provided on the upper portion of the memory string even in the case where the hollow semiconductor is used as the memory string portion; and it is possible to simultaneously realize an increase of the erasing speed and an increase of the cell current.

In the specification of the application, "perpendicular" and "parallel" refer to not only strictly perpendicular and strictly parallel but also include, for example, the fluctuation due to manufacturing steps, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components of nonvolatile semiconductor memory devices such as substrates, electrode films, insulating films, insulating layers, stacked structural units, charge storage layers, through-holes, semiconductor pillars, word lines, bit lines, source lines, inter-layer insulating films, and core units from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices and methods for manufacturing nonvolatile semiconductor memory devices practicable by an appropriate design modification by one skilled in the art based on the nonvolatile semiconductor memory devices and the methods for manufacturing nonvolatile semiconductor memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of steps appropriately made by one skilled in the art in regard to the embodiments described above are within the scope of the invention to the extent that the purport of the invention is included.

The invention claimed is:

1. A semiconductor memory device, comprising:
   a layer-stack including a plurality of first electrode films and a plurality of first insulating films alternately stacked in a first direction, the plurality of first electrode films respectively including a semiconductor material;
   an electrode provided above the layer-stack via a second insulating film and including a semiconductor material;
   a first semiconductor pillar extending through the layer-stack and the electrode in the first direction, the first semiconductor pillar having an annular shape when viewed from the first direction;
   a first metal plug disposed above the first semiconductor pillar; and
   a first semiconductor layer extending inside the first semiconductor pillar in the first direction and being in contact with the first metal plug and an inner wall of the first semiconductor pillar, wherein
   the first metal plug is in contact with the first semiconductor pillar via the first semiconductor layer.

2. The device according to claim 1, further comprising:
   a stacked film provided between the first semiconductor pillar and the plurality of first electrode films,
   the stacked film including:
      a charge storage layer provided between the first semiconductor pillar and the plurality of first electrode films;
      a third insulating film provided between the plurality of first electrode films and the charge storage layer; and
      a fourth insulating film provided between the first semiconductor pillar and the charge storage layer.

3. The device according to claim 1, further comprising:
   a second semiconductor pillar adjacent to the first semiconductor pillar in a second direction crossing the first direction, the second semiconductor pillar extending through the layer-stack and the electrode in the first direction, the second semiconductor pillar having an annular shape when viewed from the first direction;
   a second metal plug disposed above the second semiconductor pillar;
   a second semiconductor layer extending inside the second semiconductor pillar in the first direction and being in contact with the second metal plug and an inner wall of the second semiconductor pillar;
   a connection portion contacting a lower end of the first semiconductor pillar and a lower end of the second semiconductor pillar.

4. The device according to claim 3, further comprising:
   a first core disposed in an inner side of the first semiconductor pillar; and
   a second core disposed in an inner side of the second semiconductor pillar, wherein:
   the first core includes a fifth insulating film and a first conducting layer, the fifth insulating film provided on the inner wall of the first semiconductor pillar, the first conducting layer disposed on an inner side of the fifth insulating film and in contact with the first semiconductor layer;
   the second core includes a sixth insulating film and a second conducting layer, the sixth insulating film being provided on the inner wall of the second semiconductor pillar, the second conducting layer disposed on an inner side of the sixth insulating film and in contact with the second semiconductor layer; and
   the fifth insulating film and the sixth insulating film are in contact with each other in the connection portion, and the first conducting layer and the second conducting layer are not in contact with each other in the connection portion.

5. The device according to claim 1, wherein the first semiconductor layer includes polysilicon.

6. The device according to claim 1, wherein the first semiconductor pillar includes polysilicon.

7. The device according to claim 1, further comprising an insulating layer stacked on the electrode in the first direction, wherein the insulating layer includes silicon and oxygen elements.

8. The device according to claim 7, further comprising a first core disposed through the first semiconductor pillar in the first direction, the first core being recessed from an upper face of the insulating layer, wherein the first core includes silicon nitride.

9. The device according to claim 7, further comprising a first core disposed through the first semiconductor pillar in the first direction, the first core being recessed from an upper face of the insulating layer, wherein the first core includes silicon oxide.

10. The device according to claim 1, further comprising:
an insulating layer stacked on the electrode in the first direction; and
a first core disposed through the first semiconductor pillar in the first direction, the first core being recessed from an upper face of the insulating layer,
wherein an upper end of the first semiconductor pillar is disposed above an upper end of the first core.

11. The device according to claim 1, further comprising:
an insulating layer stacked on the electrode in the first direction; and
a first core extending through the first semiconductor pillar in the first direction, the first core being recessed from an upper face of the insulating layer,
wherein an upper end of the first core is disposed above the electrode and below an upper end of the insulating layer.

12. The device according to claim 11, further comprising:
a source-drain diffusion region provided in the first semiconductor pillar at a position proximal to an upper end of the electrode,
a lower end of the source-drain diffusion region being positioned downward from the upper end of the electrode.

13. The device according to claim 1, further comprising:
an insulating layer stacked on the electrode in the first direction; and
a first core extending through the first semiconductor pillar in the first direction, the first core being recessed from an upper face of the insulating layer,
wherein an upper end of the first core is disposed between an upper end and a lower end of the electrode, and a lower end of the first semiconductor layer faces the electrode.

14. The device according to claim 1, further comprising:
an insulating layer stacked on the electrode in the first direction; and
a first core disposed through the first semiconductor pillar in the first direction, the first core being recessed from an upper face of the insulating layer,
wherein the first core includes a barrier insulating film and a conducting layer, the barrier insulating film being provided on a side wall of the first semiconductor pillar, the conducting layer disposed on an inner side of the barrier insulating film and in contact with the first semiconductor layer.

15. The device according to claim 1, further comprising an insulating layer stacked on the electrode in the first direction, wherein a diameter of the first semiconductor pillar opposing to an upper end of the insulating layer is larger than a diameter of the first semiconductor pillar opposing to the electrode.

* * * * *